United States Patent
Huang et al.

(10) Patent No.: US 11,996,466 B2
(45) Date of Patent: May 28, 2024

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Chen-Huang Huang, Hsinchu (TW); Ming-Jhe Sie, Taipei (TW); Cheng-Chung Chang, Kaohsiung (TW); Shao-Hua Hsu, Taitung (TW); Shu-Uei Jang, Hsinchu (TW); An Chyi Wei, Hsinchu (TW); Shiang-Bau Wang, Pingzchen (TW); Ryan Chia-Jen Chen, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 68 days.

(21) Appl. No.: 17/739,708

(22) Filed: May 9, 2022

(65) Prior Publication Data
US 2022/0262920 A1    Aug. 18, 2022

Related U.S. Application Data

(63) Continuation of application No. 16/745,796, filed on Jan. 17, 2020, now Pat. No. 11,329,140.

(51) Int. Cl.
*H01L 21/768* (2006.01)
*H01L 21/8238* (2006.01)
(Continued)

(52) U.S. Cl.
CPC .. *H01L 29/6656* (2013.01); *H01L 21/823821* (2013.01); *H01L 21/823864* (2013.01);
(Continued)

(58) Field of Classification Search
None
See application file for complete search history.

(56) References Cited

U.S. PATENT DOCUMENTS

| 8,940,644 B2 | 1/2015 | Mizutani et al. |
| 10,797,175 B2 | 10/2020 | Lin et al. |

(Continued)

FOREIGN PATENT DOCUMENTS

| JP | 2007150234 A | 6/2007 |
| JP | 2012084882 A | 4/2012 |

(Continued)

*Primary Examiner* — Joseph C. Nicely
*Assistant Examiner* — Lamont B Koo
(74) *Attorney, Agent, or Firm* — Slater Matsil, LLP

(57) ABSTRACT

A method of forming a gas spacer in a semiconductor device and a semiconductor device including the same are disclosed. In accordance with an embodiment, a method includes forming a gate stack over a substrate; forming a first gate spacer on sidewalls of the gate stack; forming a second gate spacer on sidewalls of the first gate spacer; removing the second gate spacer using an etching process to form a first opening, the etching process being performed at a temperature less than 0° C., the etching process using an etching solution including hydrogen fluoride; and depositing a dielectric layer over the first gate spacer and the gate stack, the dielectric layer sealing a gas spacer in the first opening.

20 Claims, 38 Drawing Sheets

(51) Int. Cl.
  *H01L 27/092* (2006.01)
  *H01L 29/66* (2006.01)
  *H01L 29/78* (2006.01)

(52) U.S. Cl.
  CPC .... *H01L 27/0924* (2013.01); *H01L 29/66545* (2013.01); *H01L 29/66795* (2013.01); *H01L 29/785* (2013.01)

(56) References Cited

U.S. PATENT DOCUMENTS

| | | |
|---|---|---|
| 2016/0079081 A1 | 3/2016 | Toda et al. |
| 2017/0250261 A1* | 8/2017 | Kim .................. H01L 29/78696 |
| 2018/0012775 A1 | 1/2018 | Byun et al. |
| 2018/0151679 A1 | 5/2018 | Wang et al. |
| 2018/0166553 A1 | 6/2018 | Lee et al. |
| 2019/0027373 A1 | 1/2019 | Kwon et al. |
| 2019/0043959 A1 | 2/2019 | Lee et al. |
| 2019/0334008 A1 | 10/2019 | Chen et al. |
| 2019/0378724 A1 | 12/2019 | Toda et al. |
| 2020/0006158 A1 | 1/2020 | Chen et al. |

FOREIGN PATENT DOCUMENTS

| | | |
|---|---|---|
| KR | 20130105364 A | 9/2013 |
| KR | 20180068846 A | 6/2018 |
| KR | 20190064506 A | 6/2019 |
| TW | 202002025 A | 1/2020 |

\* cited by examiner

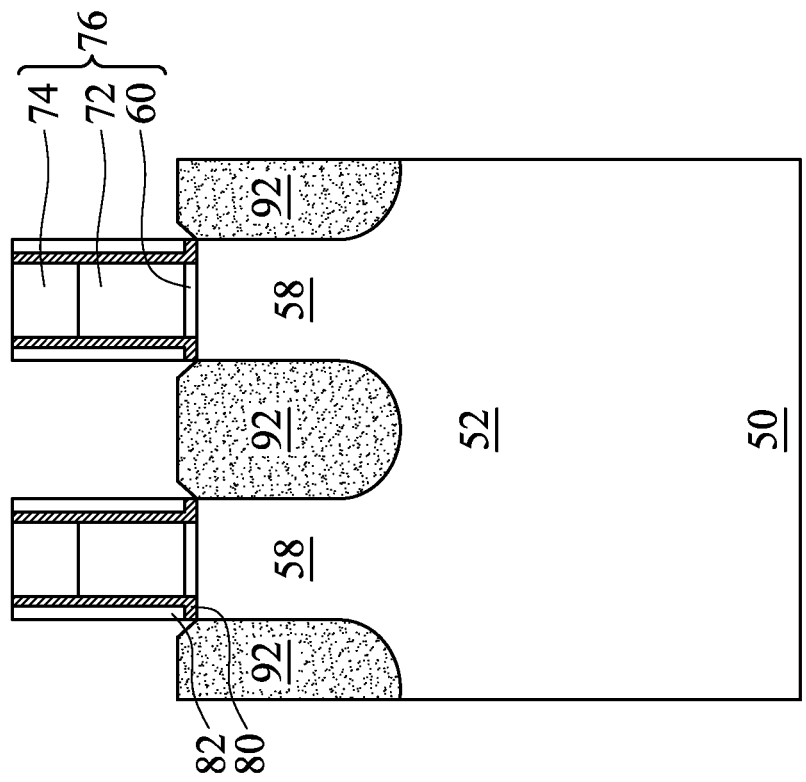
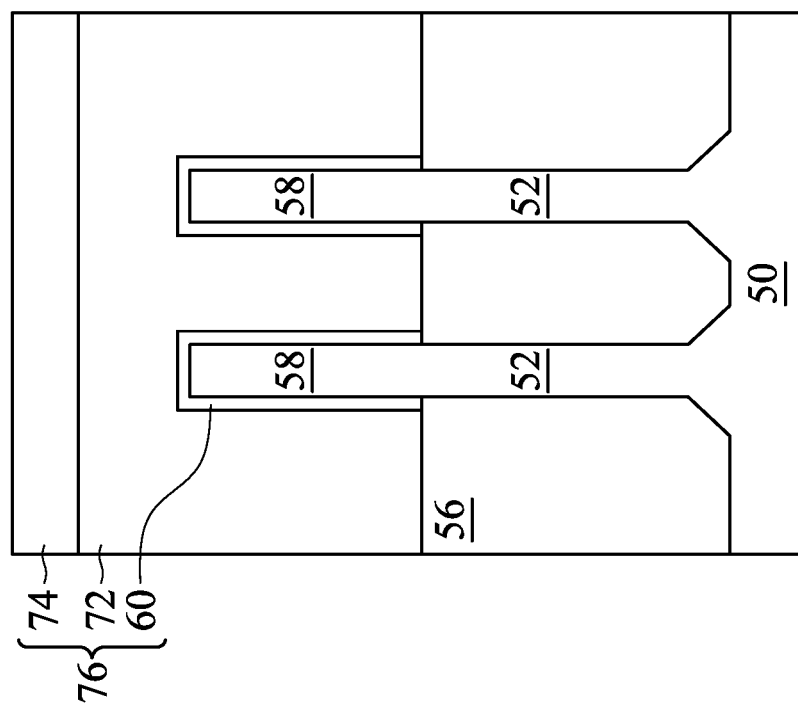
Figure 11A
Figure 11B

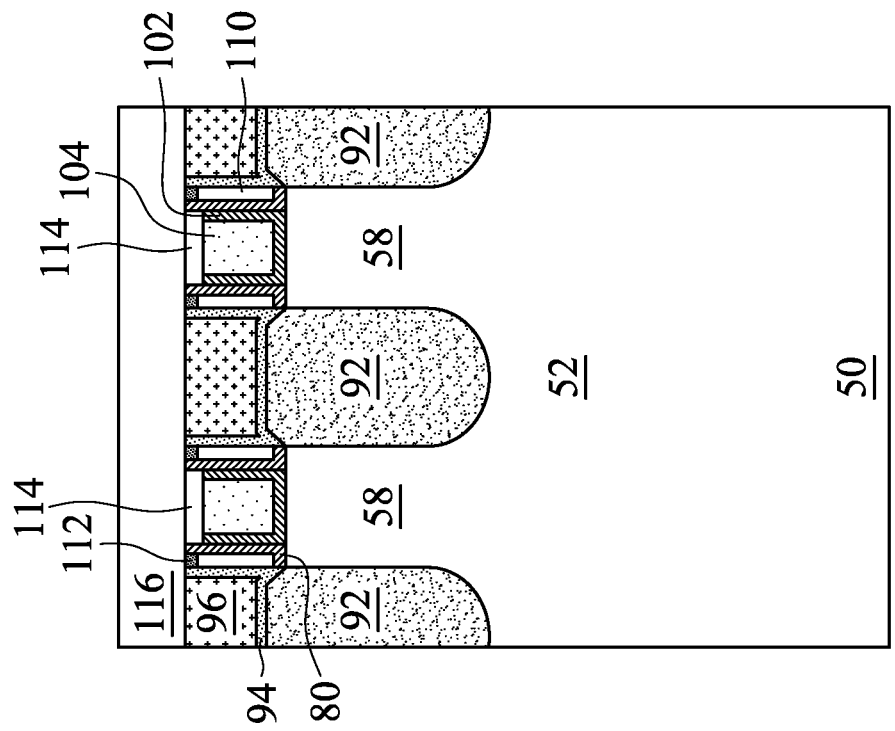
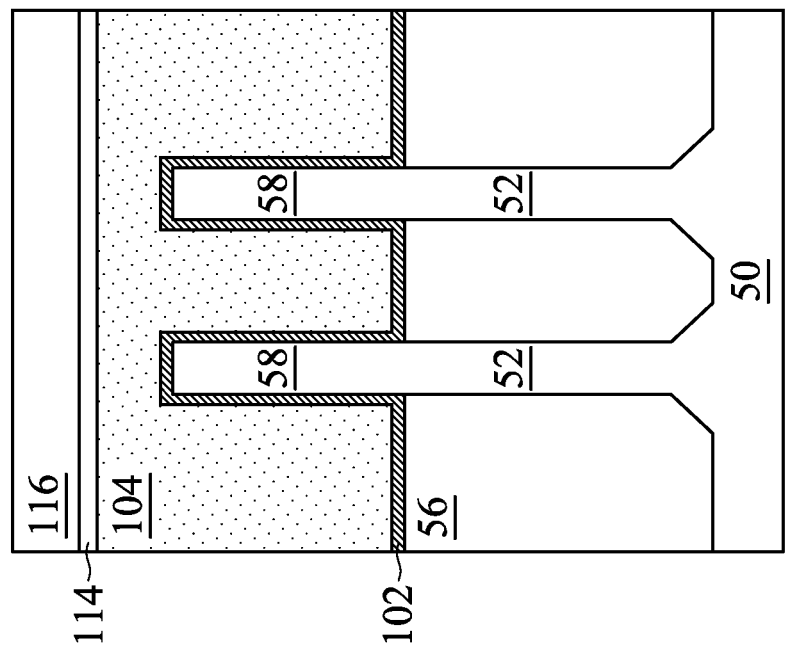
Figure 20A
Figure 20B

SEMICONDUCTOR DEVICE AND METHOD OF MANUFACTURE

PRIORITY CLAIM AND CROSS-REFERENCE

This application is a continuation of U.S. patent application Ser. No. 16/745,796 entitled "Semiconductor Device and Method of Manufacture," filed on Jan. 17, 2020, which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 8C, 8D, 9A, 9B, 9C, 9D, 10A, 10B, 10C, 10D, 11A, 11B, 11C, 11D, 11E, 12A, 12B, 12C, 12D, 13A, 13B, 13C, 13D, 14A, 14B, 14C, 14D, 15A, 15B, 15C, 15D, 15E, 16A, 16B, 16C, 16D, 17A, 17B, 17C, 17D, 18A, 18B, 18C, 18D, 18E, 19A, 19B, 19C, 19D, 20A, 20B, 20C, 20D, 21A, 21B, 21C, and 21D are cross-sectional views of intermediate stages in the manufacturing of FinFETs, in accordance with some embodiments.

DETAILED DESCRIPTION

Figure 1:
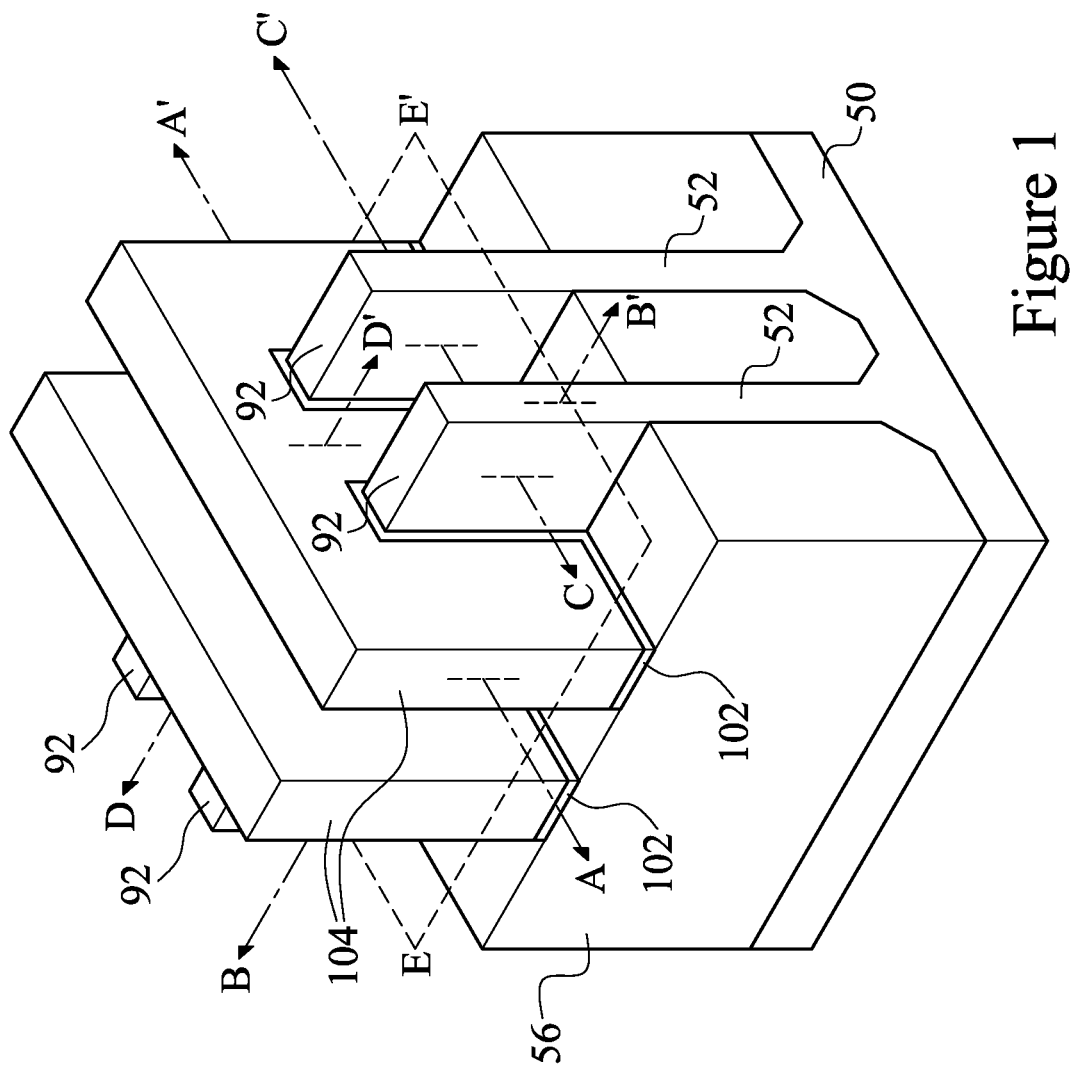
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved processes for forming gas spacers in semiconductor devices. For example, various dummy gate spacers may be removed using an etching process at a temperature less than 0° C. The etching process may use an etchant such as hydrogen fluoride and a catalyst such as water, ethanol, or the like. Performing the etching process at a temperature less than 0° C. may improve the etch selectivity of the etching process relative to structure which are not intended to be etched by the etching process. This reduces device defects and improves performance of the completed semiconductor devices formed by the improved processes.

FIG. 1 illustrates an example of a FinFET in a three-dimensional view, in accordance with some embodiments. The FinFET comprises fins 52 on a substrate 50 (e.g., a semiconductor substrate). Shallow trench isolation (STI) regions 56 are disposed in the substrate 50, and the fins 52 protrude above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as a single, continuous material as the substrate 50, the fins 52 and/or the substrate 50 may comprise a single material or a plurality of materials. In this context, the fins 52 refer to the portion extending between the neighboring STI regions 56.

Gate dielectric layers 102 are along sidewalls and over a top surface of the fins 52, and gate electrodes 104 are over the gate dielectric layers 102. Epitaxial source/drain regions 92 are disposed in opposite sides of the fin 52 with respect to the gate dielectric layers 102 and gate electrodes 104. FIG. 1 further illustrates reference cross-sections that are used in later figures. Cross-section A-A' is along a longitudinal axis of one of the gate electrodes 104 and in a direction, for example, perpendicular to the direction of current flow between the epitaxial source/drain regions 92 of the FinFET. Cross-section B-B' is perpendicular to cross-section A-A' and is along a longitudinal axis of one of the fins 52 and in a direction of, for example, a current flow between the epitaxial source/drain regions 92 of the FinFET. Cross-section C-C' is parallel to cross-section A-A' and extends through the epitaxial source/drain regions 92 of the FinFET. Cross-section D-D' is parallel to cross-section B-B' and extends through the gate electrodes 104 of the FinFET. Cross-section E-E' is perpendicular to cross-sections A-A', B-B', C-C', and D-D', parallel to a major surface of the substrate 50, and extends through the fins 52 and the gate electrodes 104. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 17B:
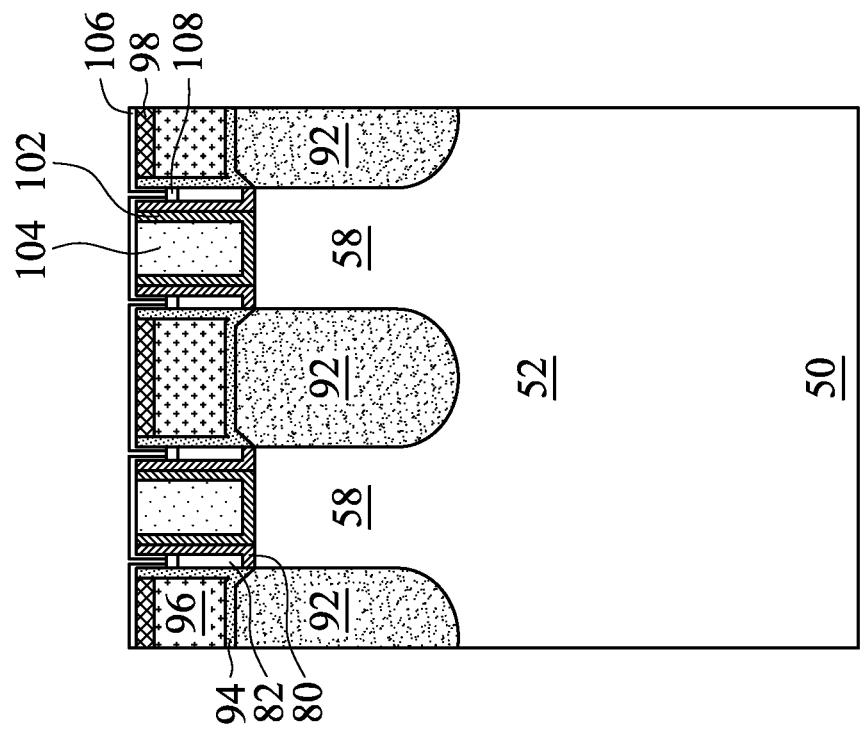
Figure 17A:
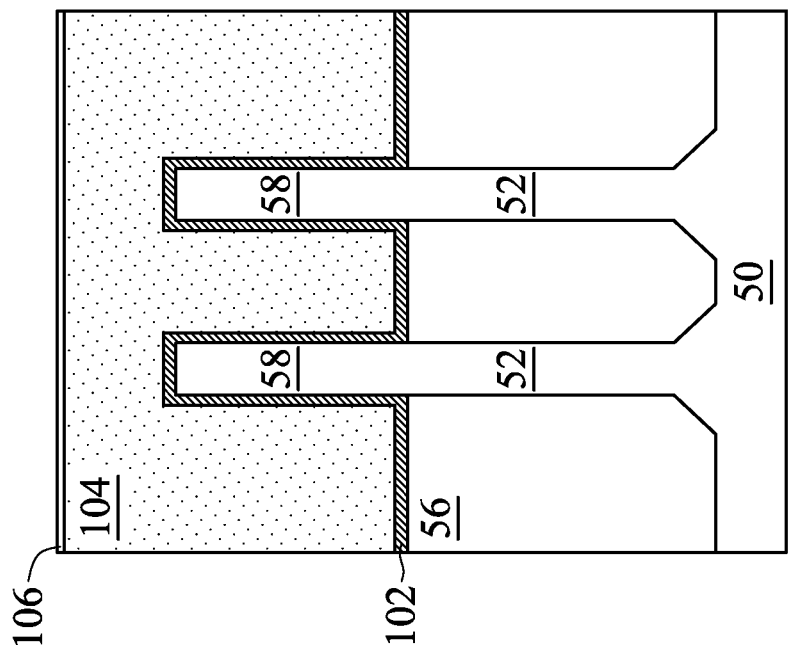
Figure 17C:
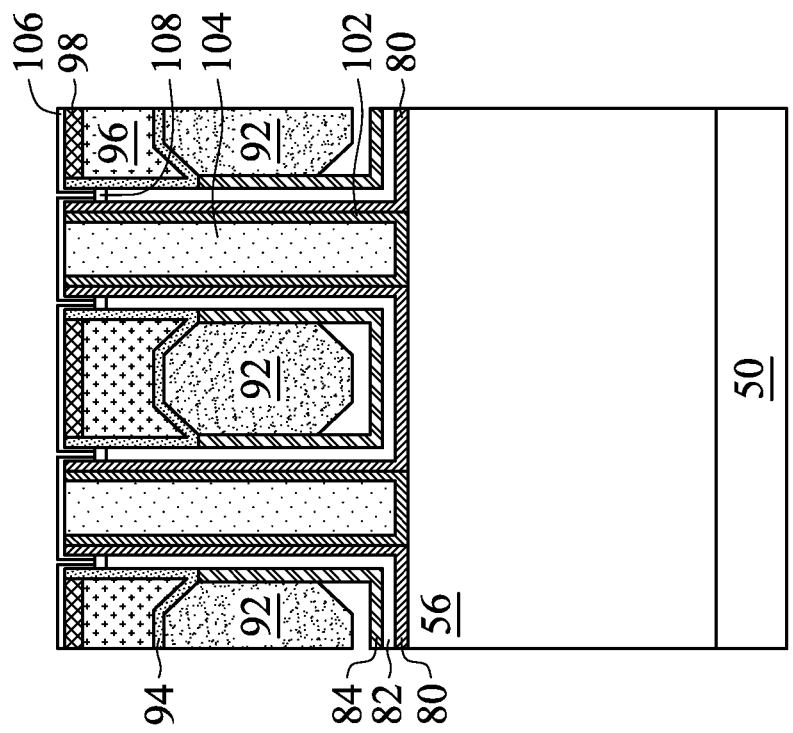
Figure 17D:
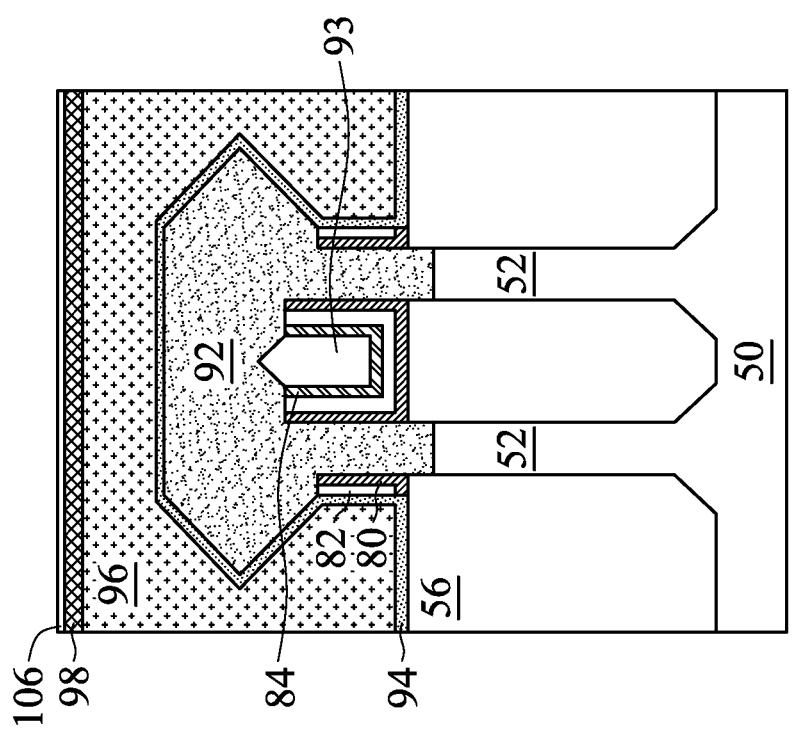
Figure 18B:
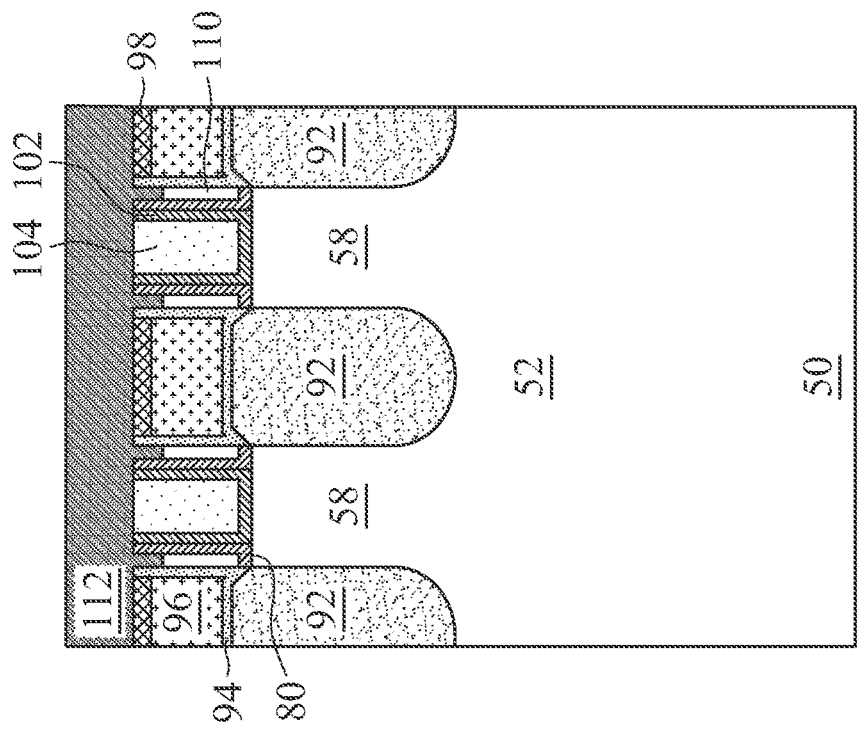
Figure 18A:
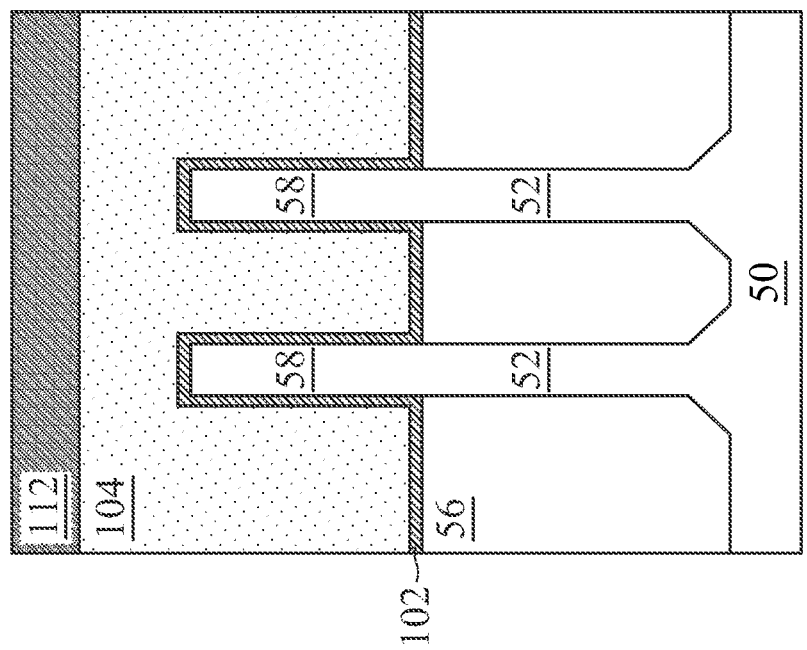
Figure 18D:
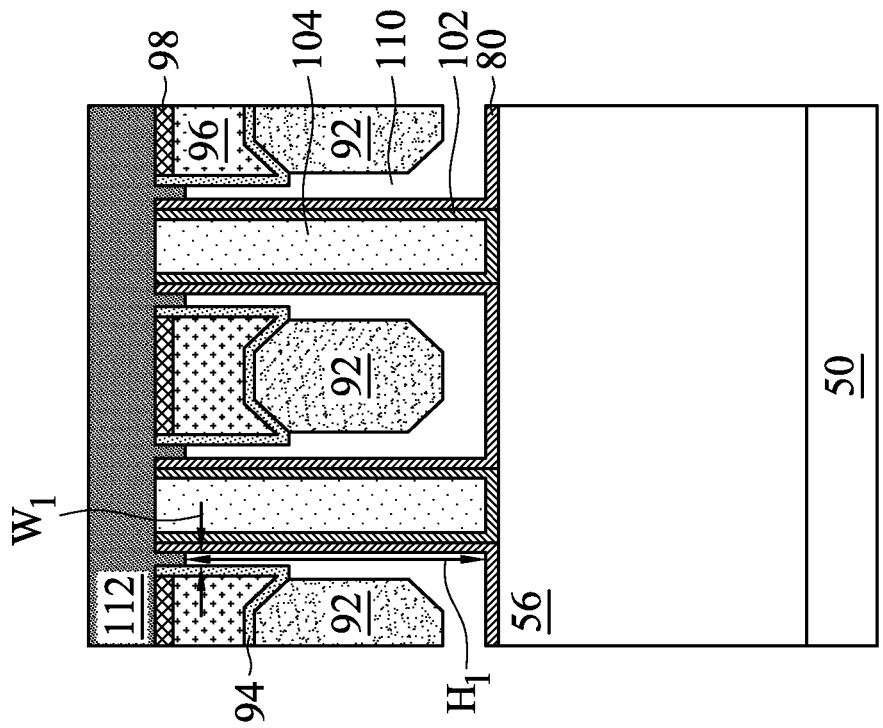
Figure 18C:
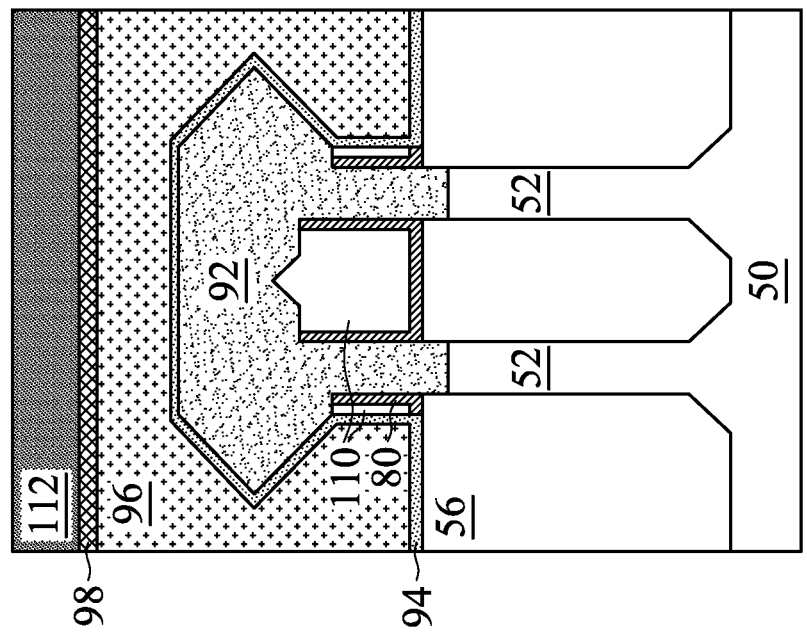
Figure 18E:
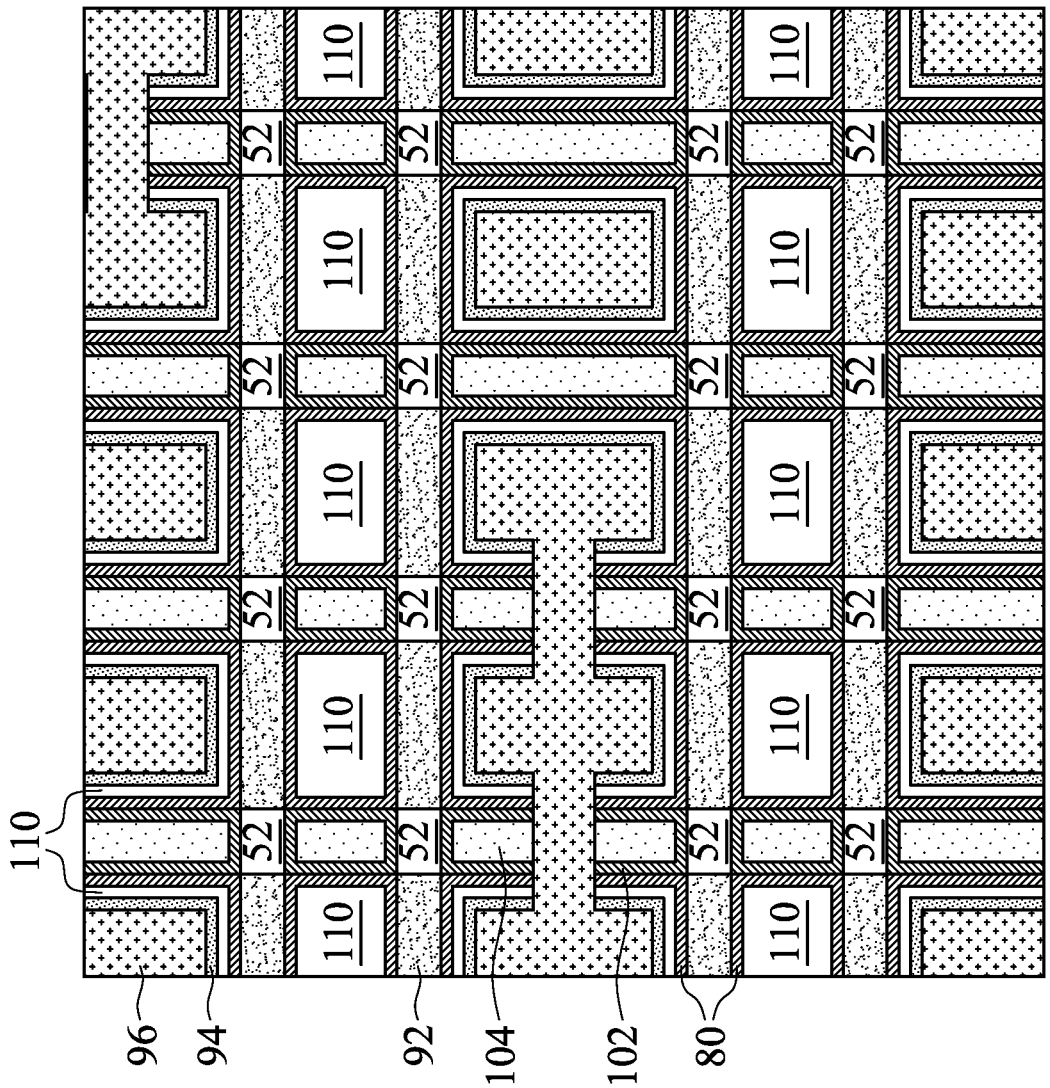
Figure 19B:
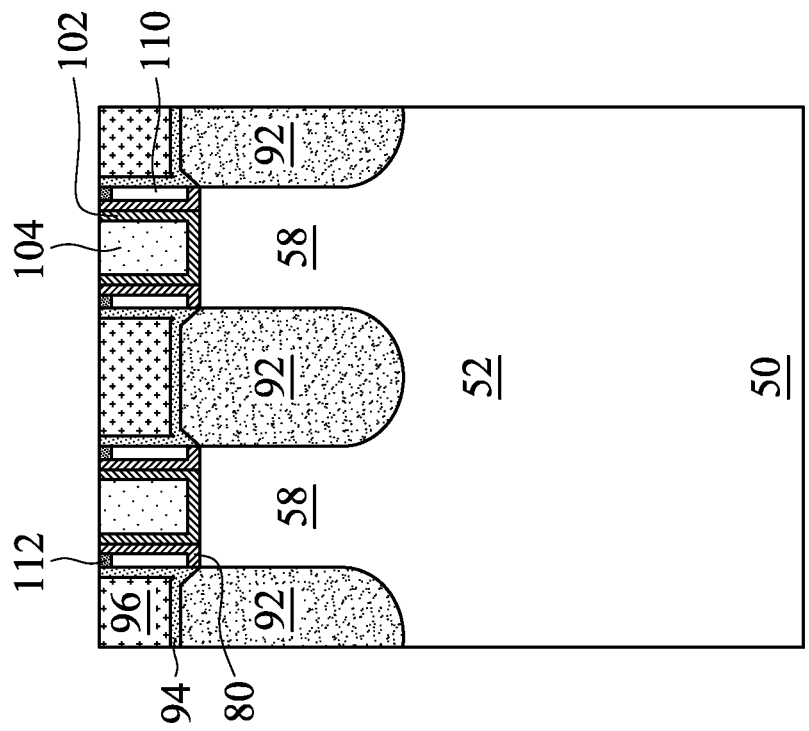
Figure 19A:
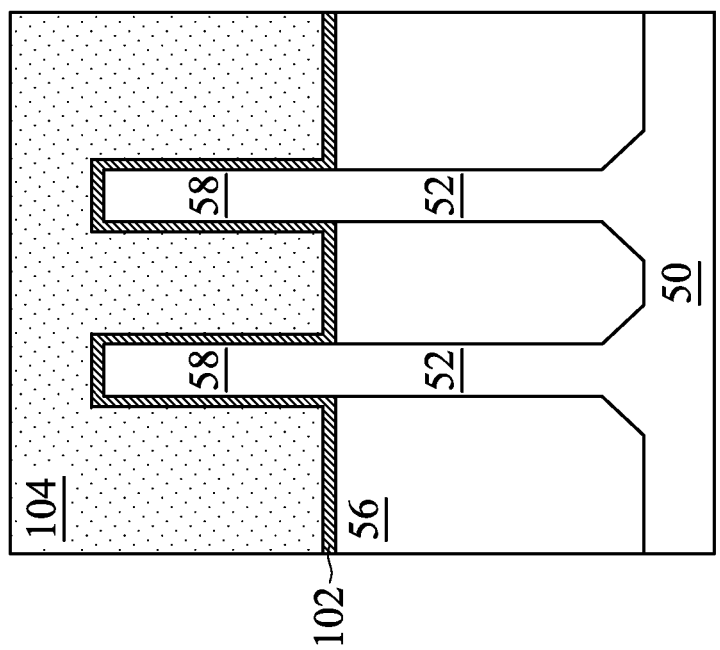
Figure 19D:
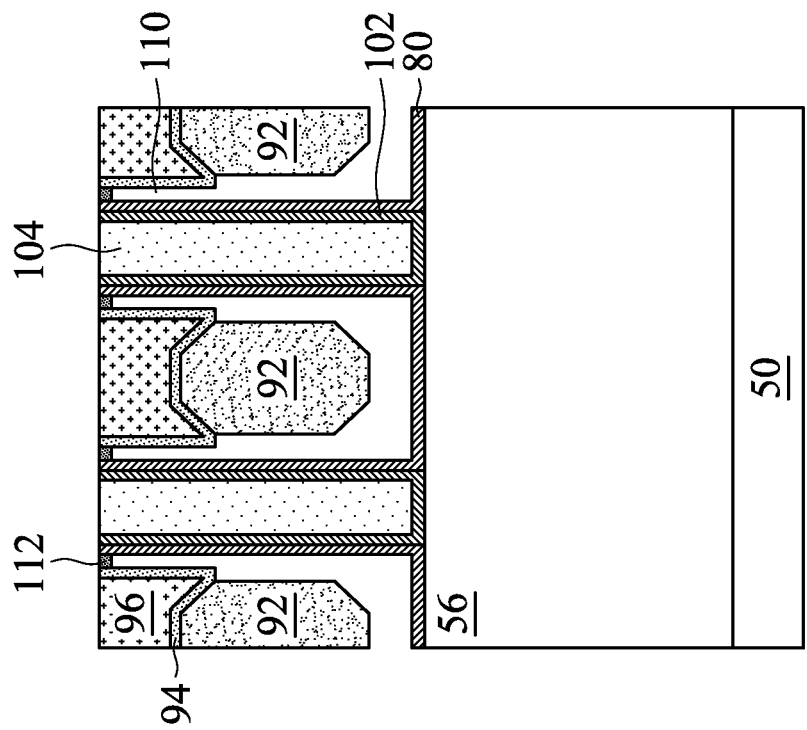
Figure 19C:
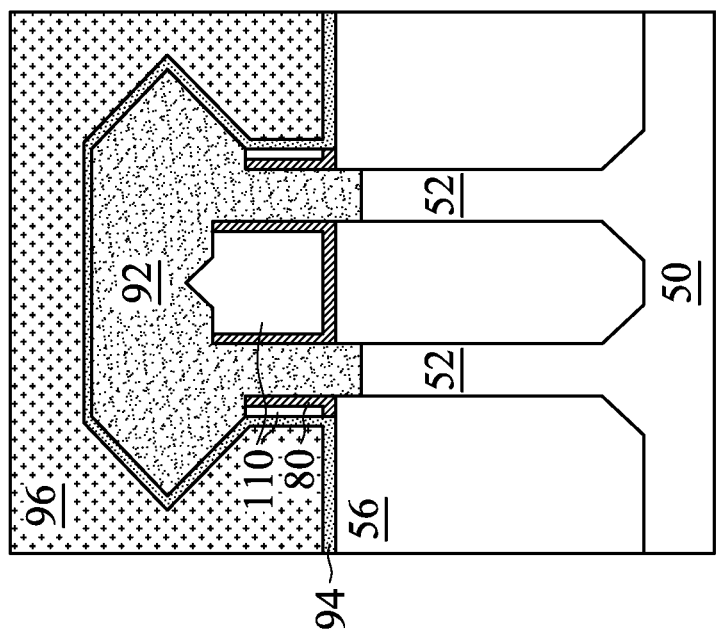

FIGS. 2 through 21D are cross-sectional views of intermediate stages in the manufacturing of FinFETs, in accordance with some embodiments. FIGS. 2 through 7 illustrate reference cross-section A-A' illustrated in FIG. 1, except for multiple fins/FinFETs. FIGS. 8A, 9A, 10A, 11A, 12A, 13A, 14A, 15A, 16A, 17A, 18A, 19A, 20A, and 21A are illustrated along reference cross-section A-A' illustrated in FIG. 1. FIGS. 8B, 9B, 10B, 11B, 12B, 13B, 14B, 15B, 15E, 16B, 17B, 18B, 19B, 20B, and 21B are illustrated along reference cross-section B-B' illustrated in FIG. 1. FIGS. 8C, 9C, 10C, 11C, 11E, 12C, 13C, 14C, 15C, 16C, 17C, 18C, 19C, 20C, and 21C are illustrated along reference cross-section C-C' illustrated in FIG. 1. FIGS. 8D, 9D, 10D, 11D, 12D, 13D, 14D, 15D, 16D, 17D, 18D, 19D, 20D, and 21D are illustrated along reference cross-section D-D' illustrated in FIG. 1. FIG. 18E is illustrated along reference cross-section E-E' illustrated in FIG. 1.

Figure 2:
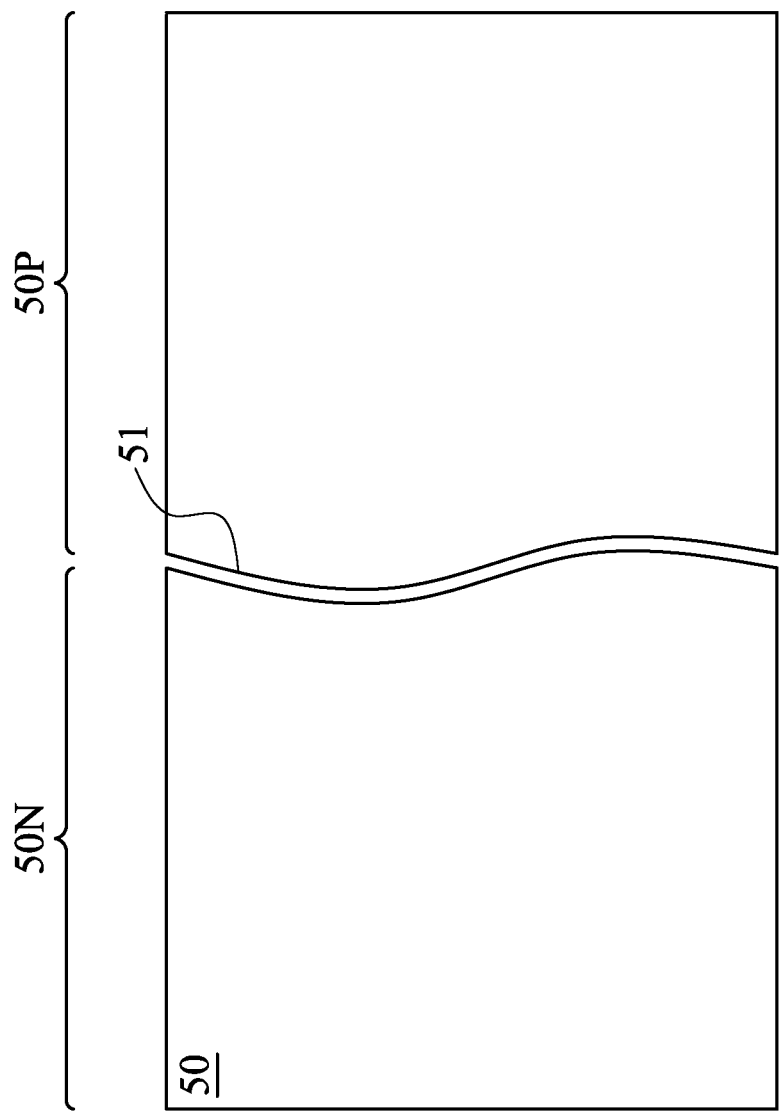

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
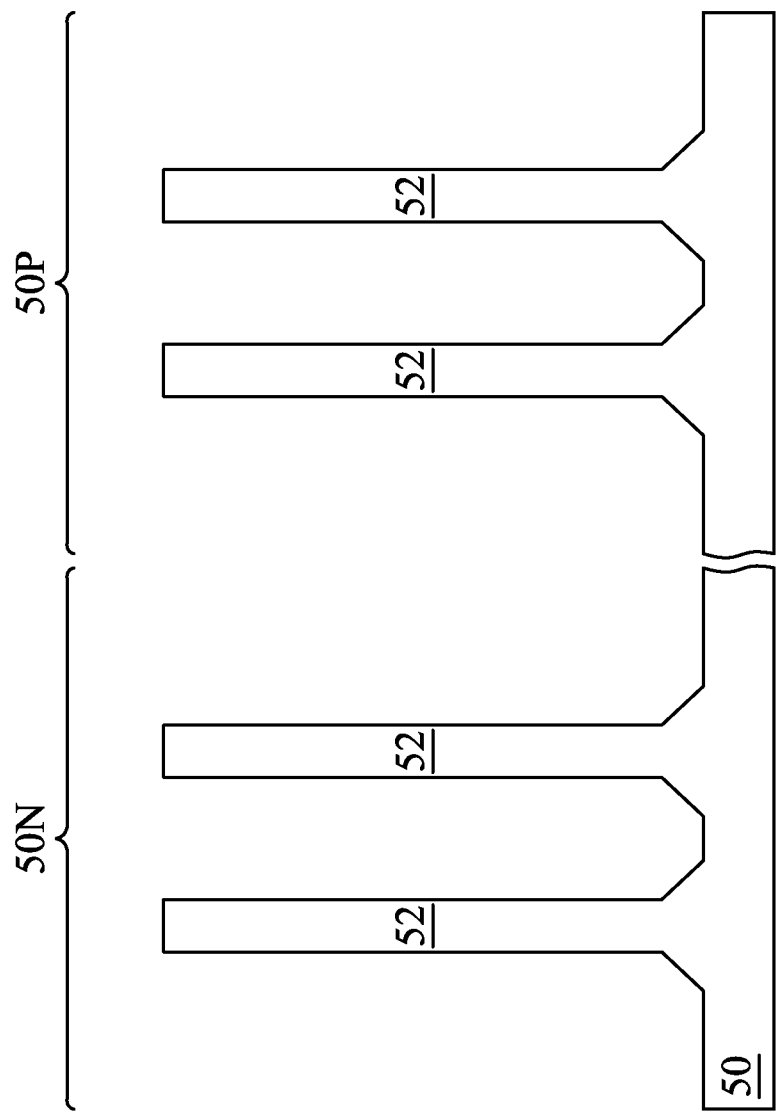

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. As illustrated in FIG. 3, the substrate 50 may include pairs of the fins 52. The fins 52 in each of the pairs of fins 52 may be separated by a distance from about 48 nm to about 56 nm and the pairs of fins 52 may be separated from adjacent pairs of fins 52 by a distance from about 48 nm to about 56 nm.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 52.

Figure 4:
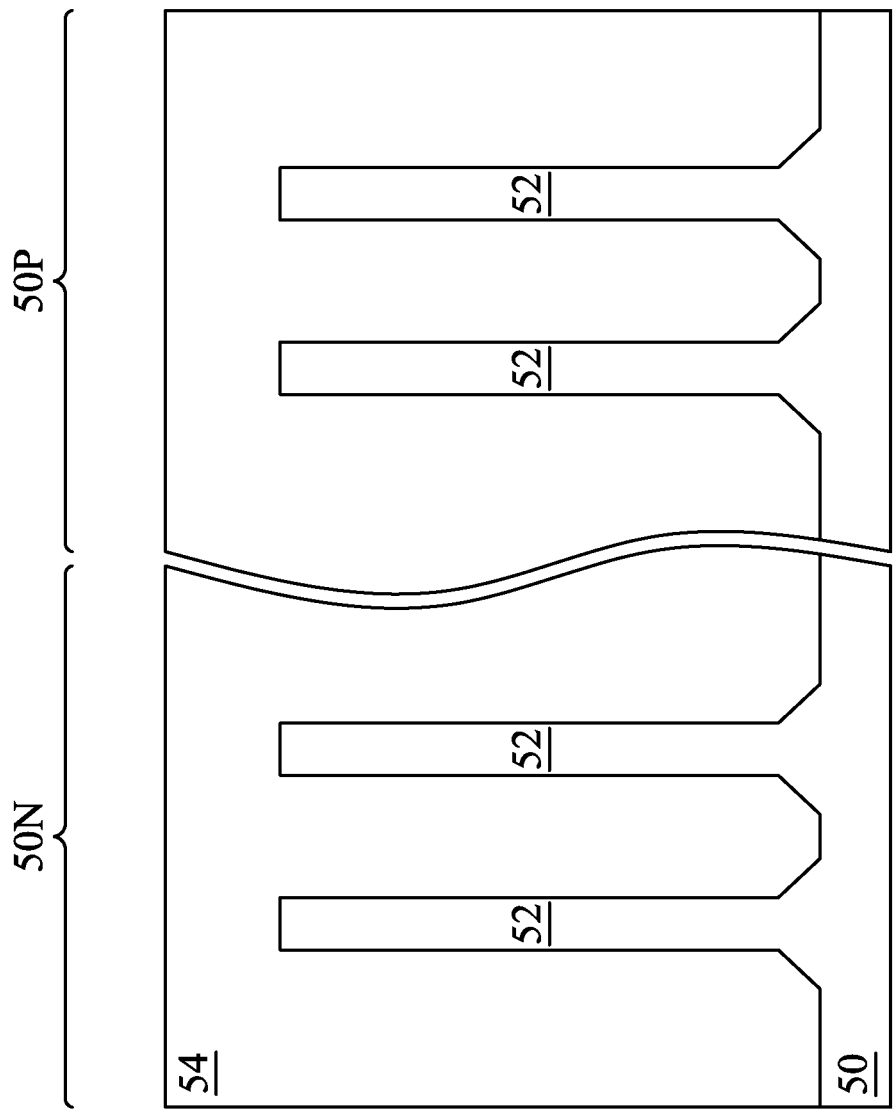

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material 54 is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not separately illustrated) may first be formed along a surface of the substrate 50 and the fins 52. Thereafter, a fill material, such as those discussed above may be formed over the liner.

Figure 5:
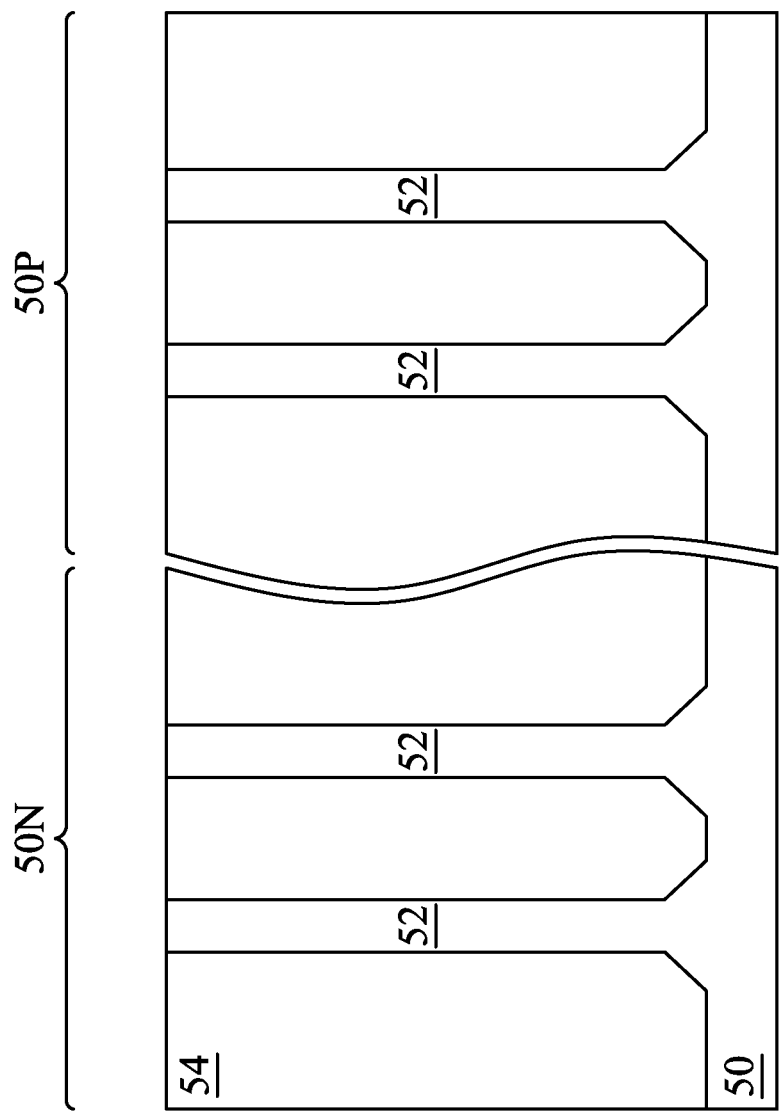

In FIG. 5, a removal process is applied to the insulation material 54 to remove excess insulation material 54 over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material 54 are level after the planarization process is complete.

Figure 6:
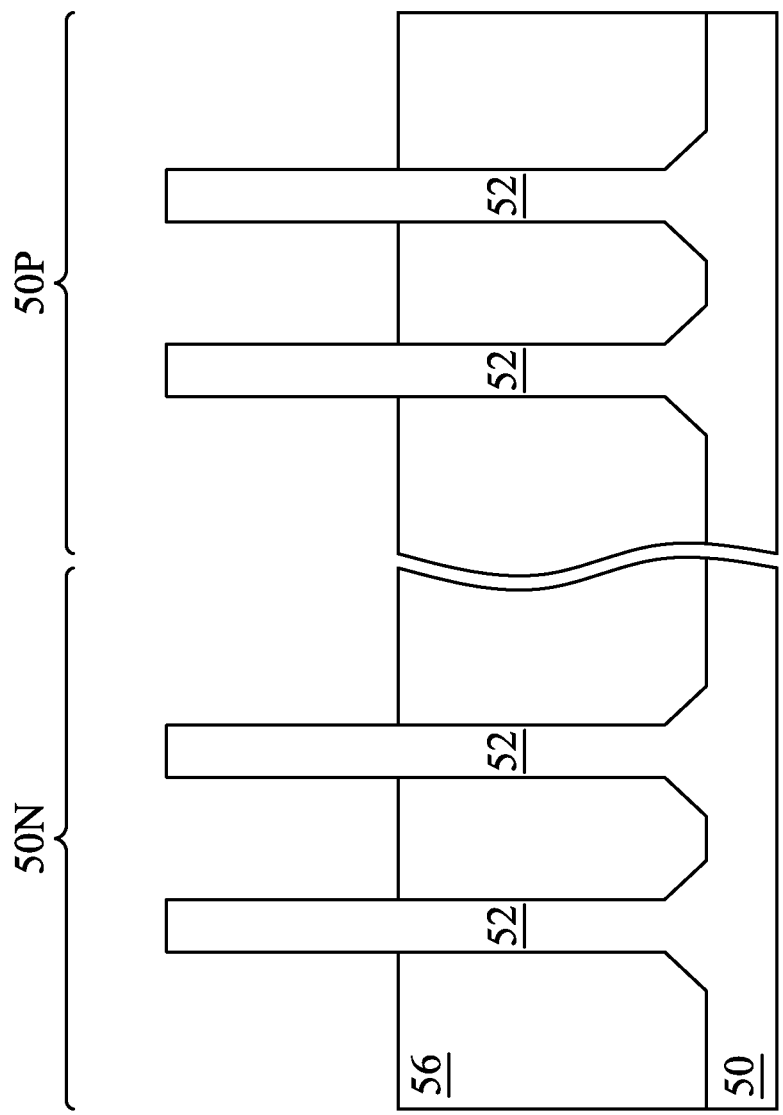

In FIG. 6, the insulation material 54 is recessed to form shallow trench isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins 52 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form the fins 52. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not separately illustrated) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not separately illustrated). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
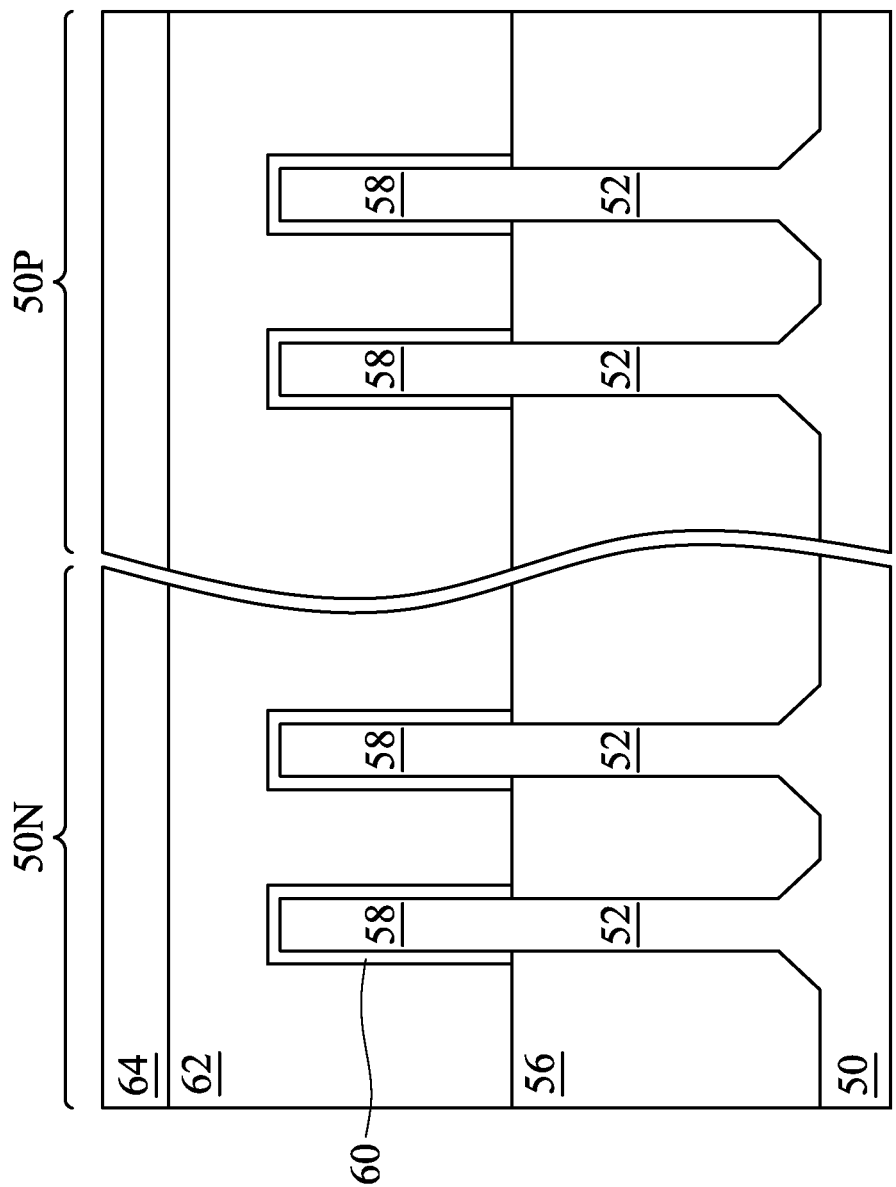
Figure 8B:
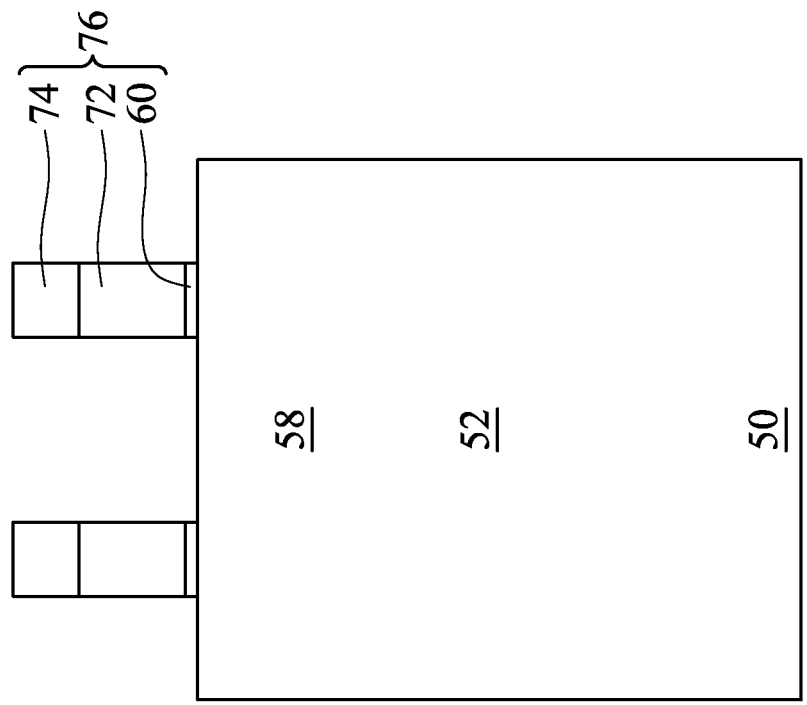
Figure 8A:
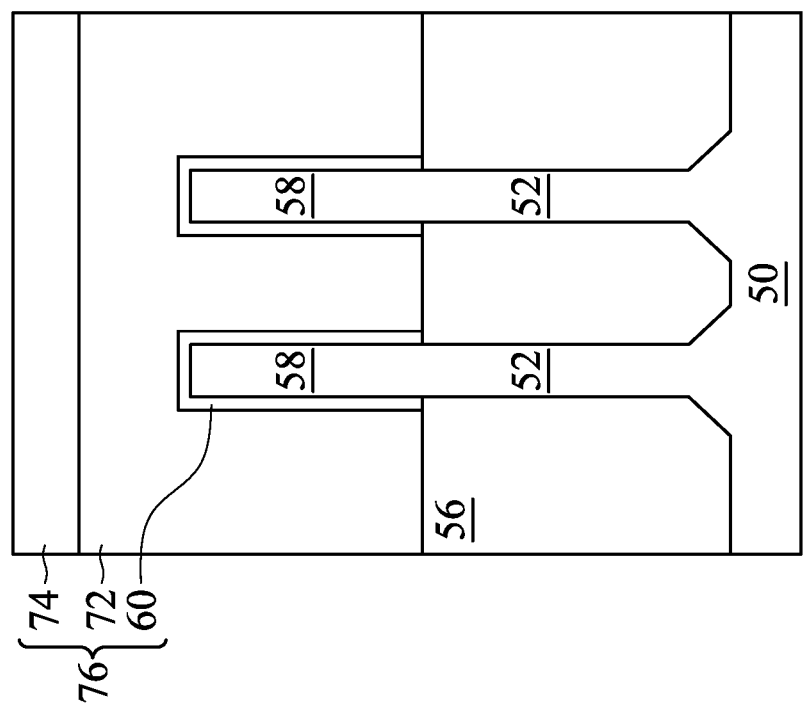
Figure 8D:
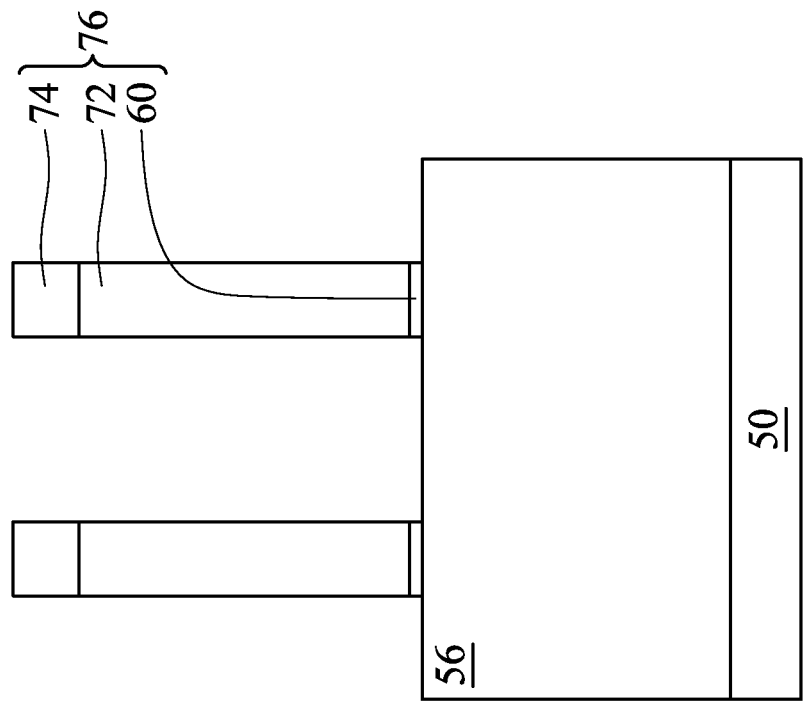
Figure 8C:
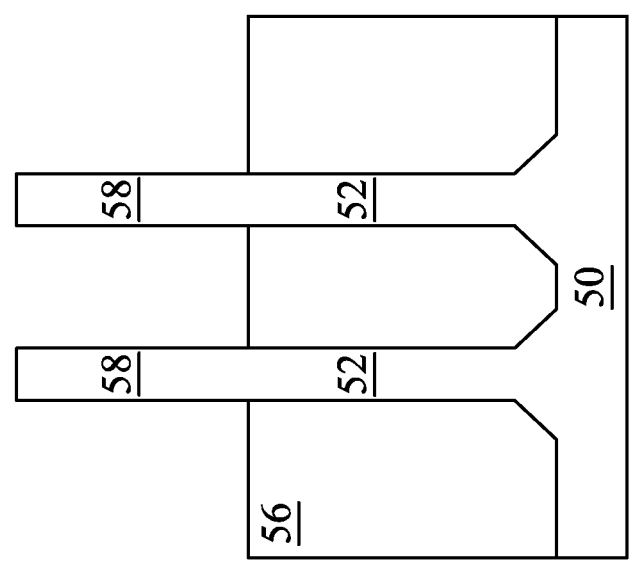
Figure 9A:
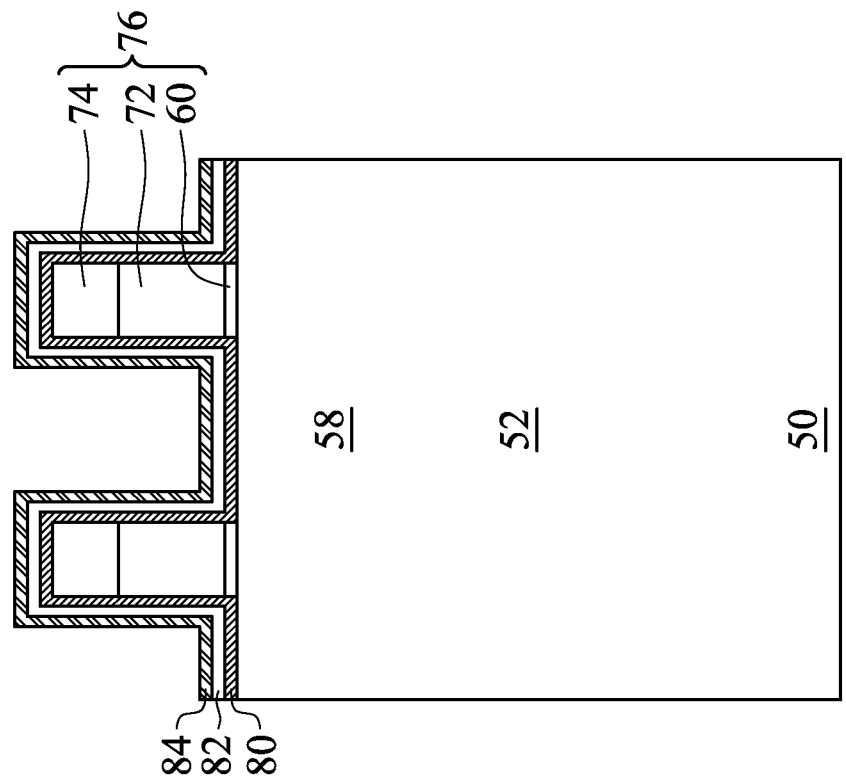
Figure 9B:
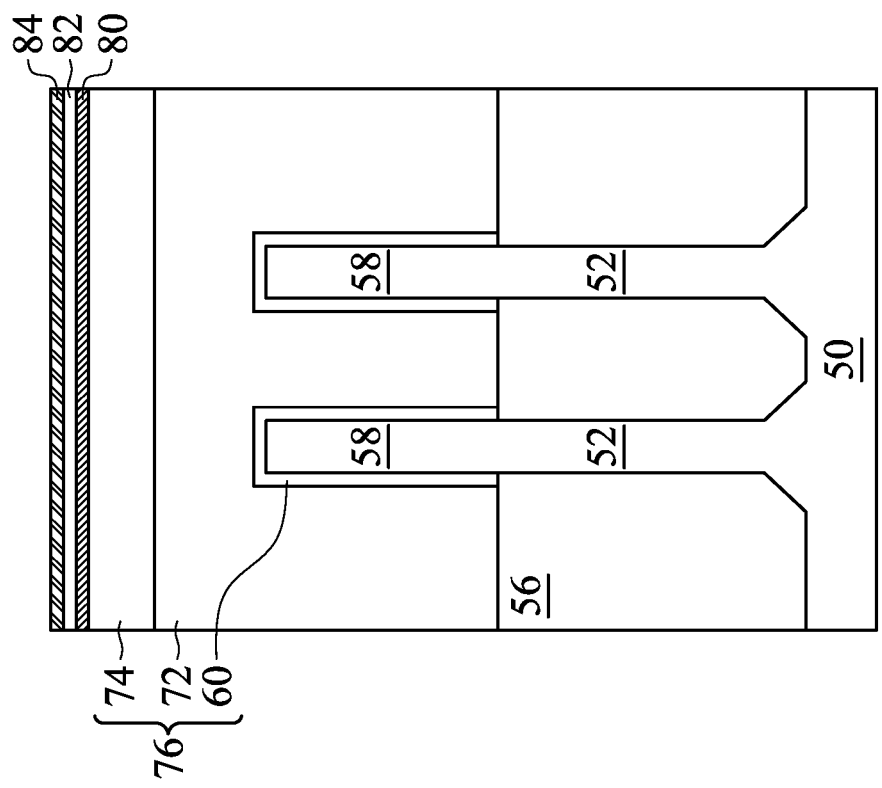
Figure 9D:
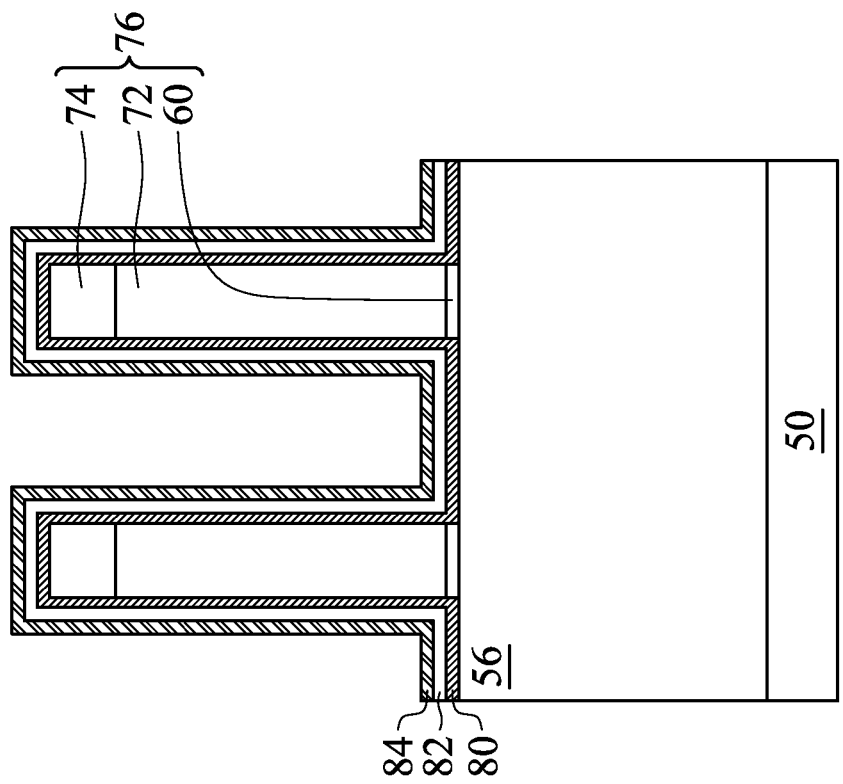
Figure 9C:
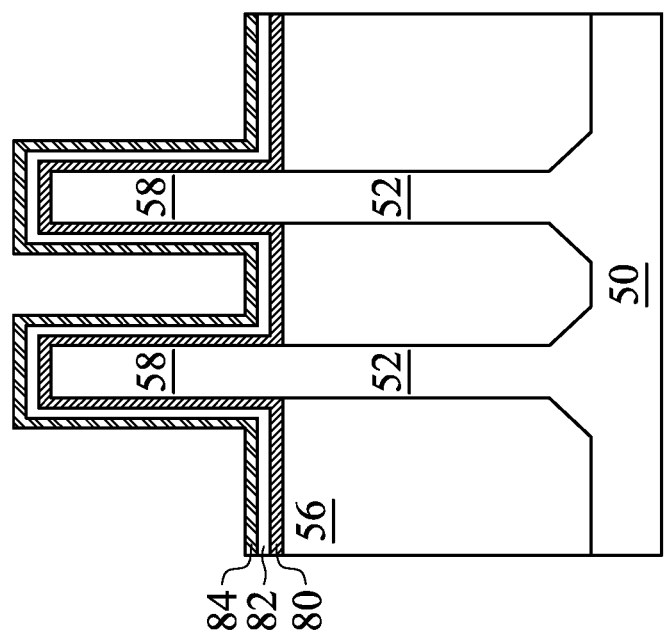

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 21D illustrate various additional steps in the manufacturing of embodiment devices. FIGS. 8A through 21D illustrate features in either of the region 50N and the region 50P. For example, the structures illustrated in FIGS. 8A through 21D may be applicable to both the region 50N and the region 50P. Differences (if any) in the structures of the region 50N and the region 50P are described in the text accompanying each figure.

In FIGS. 8A-8D, the mask layer 64 (see FIG. 7) may be patterned using acceptable photolithography and etching techniques to form masks 74. The pattern of the masks 74 then may be transferred to the dummy gate layer 62 to form dummy gates 72. The pattern of the masks 74 may also be transferred to the dummy dielectric layer 60 by an acceptable etching technique. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52. The combination of the dummy gates 72, the masks 74, and the dummy dielectric layer 60 may be referred to as dummy gate stacks 76. The dummy gate stacks 76 may be separated from adjacent dummy gate stacks by a distance from about 80 nm to about 100 nm.

In FIGS. 9A-9D, first gate spacers 80, second gate spacers 82, and third gate spacers 84 are formed on exposed surfaces of the dummy gate stacks 76 and/or the fins 52. The first gate spacers 80 may be formed by a conformal deposition process, such as atomic layer deposition (ALD), CVD, or the like. The first gate spacers 80 may comprise an insulating material, such as silicon carbonitride, silicon oxynitride, multiple layers or a combination thereof, or the like. The first gate spacers 80 may have a thickness of from about 3 nm to about 7 nm, such as about 5 nm. Forming the first gate spacers 80 to thicknesses outside of the prescribed range may affect semiconductor properties of completed NSFETs, such as capacitance, channel resistance, and the size of epitaxial source/drain regions (such as the epitaxial source/drain regions 92 discussed below with respect to FIGS. 11A-11E).

The second gate spacers 82 may be formed over the first gate spacers 80 by a conformal deposition process, such as ALD, CVD, or the like. The second gate spacers 82 may comprise an insulating material, such as silicon oxide, silicon nitride, silicon oxycarbonitride, multiple layers or a combination thereof, or the like. The second gate spacers 82 may have a thickness of from about 2 nm to about 6 nm, such as about 4 nm. Forming the second gate spacers 82 to thicknesses outside of the prescribed range may affect semiconductor properties of completed NSFETs, such as capacitance, channel resistance, and the size of epitaxial source/drain regions (such as the epitaxial source/drain regions 92 discussed below with respect to FIGS. 11A-11E).

The third gate spacers 84 may be formed over the second gate spacers 82 by a conformal deposition process, such as ALD, CVD, or the like. The third gate spacers 84 may comprise an insulating material, such as silicon nitride, silicon oxide, silicon oxycarbonitride, multiple layers or a combination thereof, or the like. The third gate spacers 84 may have a thickness of from about 2 nm to about 5 nm, such as about 4 nm. Forming the third gate spacers 84 to thicknesses outside of the prescribed range may affect semiconductor properties of completed NSFETs, such as capacitance, channel resistance, and the size of epitaxial source/drain regions (such as the epitaxial source/drain regions 92 discussed below with respect to FIGS. 11A-11E).

The first gate spacers 80 may be formed of a material having a different etch selectivity from the material of the second gate spacers 82 and the third gate spacers 84. As such, the second gate spacers 82 and the third gate spacers 84 may be removed without removing the first gate spacers 80. The second gate spacers 82 and the third gate spacers 84 may be formed of the same or different materials and may have the same or different etch selectivity from one another. The first gate spacers 80 and the second gate spacers 82 may be used to mask portions of the substrate 50 during the formation of lightly doped source/drain regions (discussed below with respect to FIGS. 10A-10D. The third gate spacers 84 may be used to control the growth of epitaxial source/drain regions (such as the epitaxial source/drain regions 92 discussed below with respect to FIGS. 11A-11E).

Figure 10B:
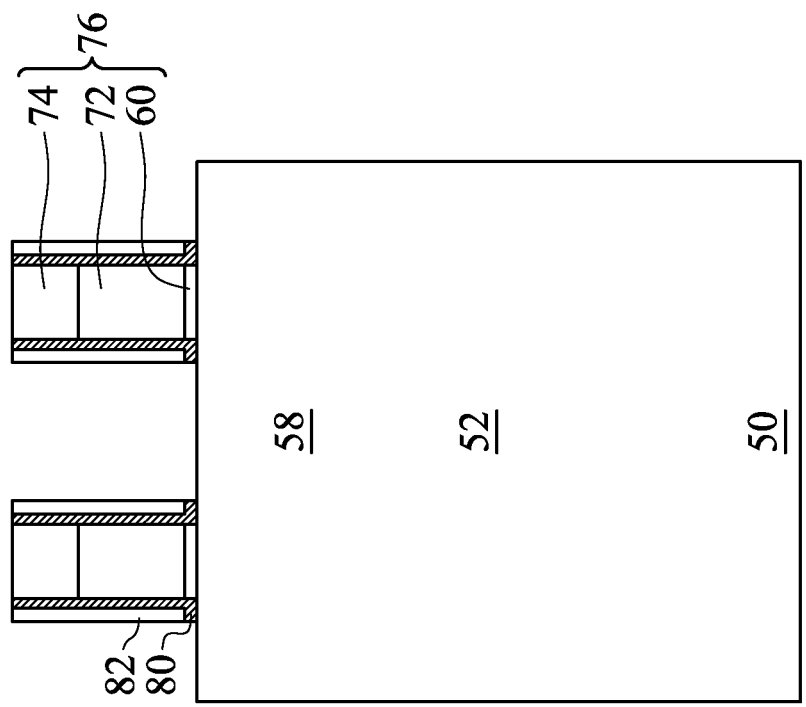
Figure 10A:
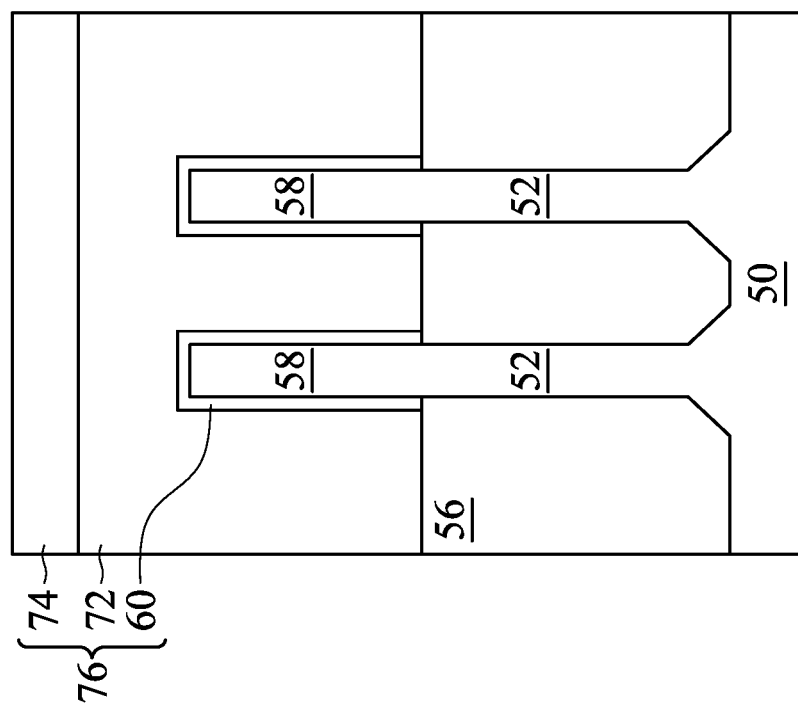
Figure 10D:
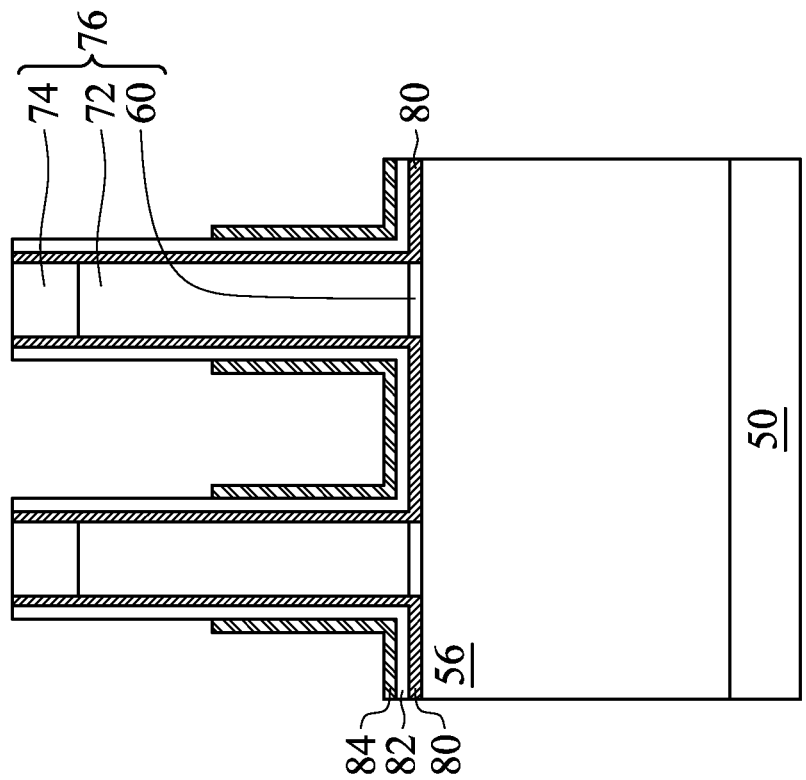
Figure 10C:
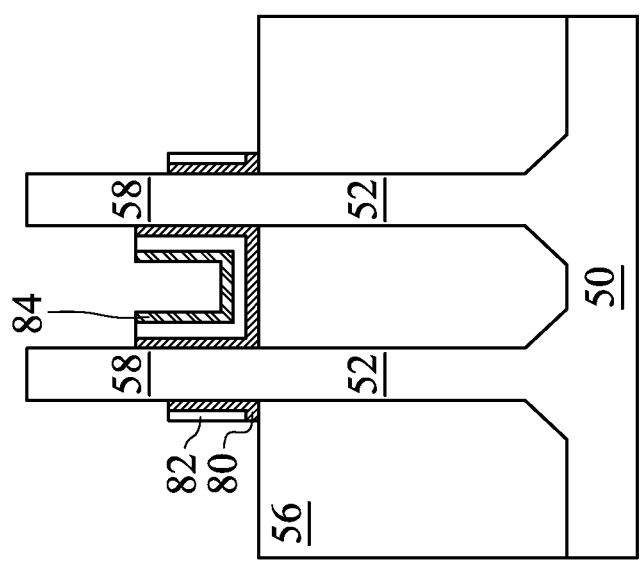

In FIGS. 10A-10D, the first gate spacers 80, the second gate spacers 82, and the third gate spacers 84 are etched. The first gate spacers 80, the second gate spacers 82, and the third gate spacers 84 may be etched by an anisotropic etch process, an isotropic etch process, or any combination of anisotropic and isotropic etch processes. As illustrated in FIGS. 10B-10D, residual portions of the first gate spacers 80, the second gate spacers 82, and the third gate spacers 84 may remain adjacent the fins 52 and adjacent the dummy gate stacks 76.

Specifically, in FIG. 10A, the first gate spacers 80, the second gate spacers 82, and the third gate spacers 84 are removed from top surfaces of the masks 74. In FIG. 10B, the third gate spacers 84 are removed from top surfaces and sidewalls of the dummy gate stacks 76 and top surfaces of the fins 52. Further in FIG. 10B, the second gate spacers 82 and the first gate spacers 80 are removed from top surfaces of the dummy gate stacks 76 and the fins 52 and the second gate spacers 82 and the first gate spacers 80 remain on sidewalls of the dummy gate stacks 76. In FIG. 10C, the third gate spacers 84 are removed from top surfaces and outer sidewalls of the pair of fins 52 and from top surfaces of the STI regions 56 outside of the pair of fins 52. Further in FIG. 10C, the third gate spacers 84 remain on inner sidewalls of the pair of fins 52 and extend continuously between the adjacent fins 52 over the STI region 56. The second gate spacers 82 and the first gate spacers 80 are removed from top surfaces and upper portions of the sidewalls of the fins 52 and from top surfaces of the STI regions 56 outside of the pair of fins 52. Also in FIG. 10C, the first gate spacers 80 and the second gate spacers 82 remain on lower portions of the sidewalls of the fins 52 and extend continuously between the adjacent fins 52 over the STI region 56. In FIG. 10D, the third gate spacers 84 are removed from top surfaces and upper portions of the sidewalls of the dummy gate stacks 76 and the third gate spacers 84 remain on lower portions of the sidewalls of the dummy gate stacks 76 and extend continuously between the adjacent dummy gate stacks 76 over the STI region 56. Further in FIG. 10D, the first gate spacers 80 and the second gate spacers 82 are removed from top surfaces of the dummy gate stacks 76 and the first gate spacers 80 and the second gate spacers 82 remain on the sidewalls of the dummy gate stacks and extend continuously between the adjacent dummy gate stacks 76 over the STI region 56.

The portions of the third gate spacers 84 remaining after the first gate spacers 80, the second gate spacers 82, and the third gate spacers 84 are etched may be used to control the epitaxial growth of epitaxial source/drain regions (e.g., epitaxial source/drain regions 92, discussed below in reference to FIGS. 11A-11E). As such, the third gate spacers 84 may be patterned based on the desired shape of the epitaxial source/drain regions 92. As illustrated in FIG. 10C, portions of the second gate spacers 82 and the first gate spacers 80 disposed on inner sidewalls of the fins 52 may have heights greater than portions of the second gate spacers 82 and the first gate spacers 80 disposed on outer sidewalls of the fins 52. This height difference is caused by the third gate spacers 84 protecting the second gate spacers 82 and the first gate spacers 80, the fins 52 shadowing the area between the fins 52, etchants flowing more readily around the portions of the second gate spacers 82 and the first gate spacers 80 disposed outside of the fins 52 than the portions disposed inside the fins 52, and the like. The first gate spacers 80, the second gate spacers 82, and the third gate spacers 84 may be formed and etched in any desired order. For example, in an embodiment, the first gate spacers 80 may be formed and etched before forming the second gate spacers 82 and the third gate spacers 84.

Implants for lightly doped source/drain (LDD) regions (not separately illustrated) may be performed at any time during the formation and etching of the first gate spacers 80, the second gate spacers 82, and the third gate spacers 84. For example, in some embodiments, the LDD regions may be implanted after forming the first gate spacers 80, before forming the second gate spacers 82 and the third gate spacers 84. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed.

The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

In FIGS. 11A-11E, epitaxial source/drain regions 92 are formed in the fins 52. The epitaxial source/drain regions 92 may exert stress in the respective channel regions 58, thereby improving performance. The epitaxial source/drain regions 92 are formed in the fins 52 such that each dummy gate 72 is disposed between respective neighboring pairs of the epitaxial source/drain regions 92. In some embodiments the epitaxial source/drain regions 92 may extend into, and may also penetrate through, the fins 52. In some embodiments, the first gate spacers 80, the second gate spacers 82, and the third gate spacers 84 are used to separate the epitaxial source/drain regions 92 from the dummy gates 72 by an appropriate lateral distance so that the epitaxial source/drain regions 92 do not short out subsequently formed gates of the resulting FinFETs.

The epitaxial source/drain regions 92 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 92 in the region 50N are epitaxially grown in the recesses. The epitaxial source/drain regions 92 may include any acceptable material, such as appropriate for n-type FinFETs. For example, if the fin 52 is silicon, the epitaxial source/drain regions 92 in the region 50N may include materials exerting a tensile strain in the channel region 58, such as silicon, SiC, SiCP, SiP, or the like. The epitaxial source/drain regions 92 in the region 50N may have surfaces raised from respective surfaces of the fins 52 and may have facets.

The epitaxial source/drain regions 92 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 92 in the region 50P are epitaxially grown in the recesses. The epitaxial source/drain regions 92 may include any acceptable material, such as appropriate for p-type FinFETs. For example, if the fin 52 is silicon, the epitaxial source/drain regions 92 in the region 50P may comprise materials exerting a compressive strain in the channel region 58, such as SiGe, SiGeB, Ge, GeSn, or the like. The epitaxial source/drain regions 92 in the region 50P may also have surfaces raised from respective surfaces of the fins 52 and may have facets.

The epitaxial source/drain regions 92 and/or the fins 52 may be implanted with dopants to form source/drain regions, similar to the process previously discussed for forming lightly-doped source/drain regions, followed by an anneal. The epitaxial source/drain regions 92 may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 92 may be in situ doped during growth.

Figure 11D:
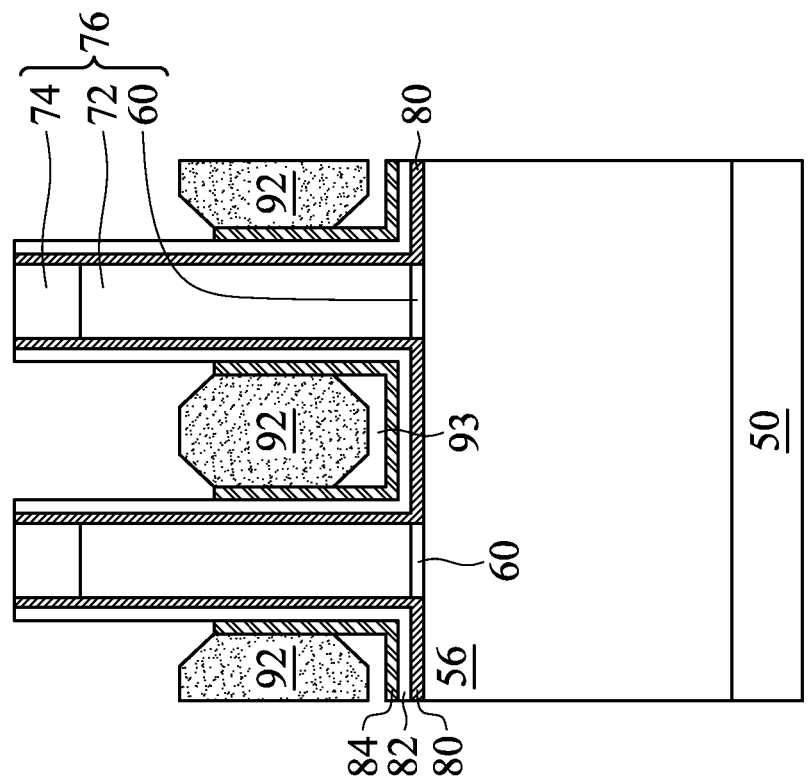
Figure 11C:
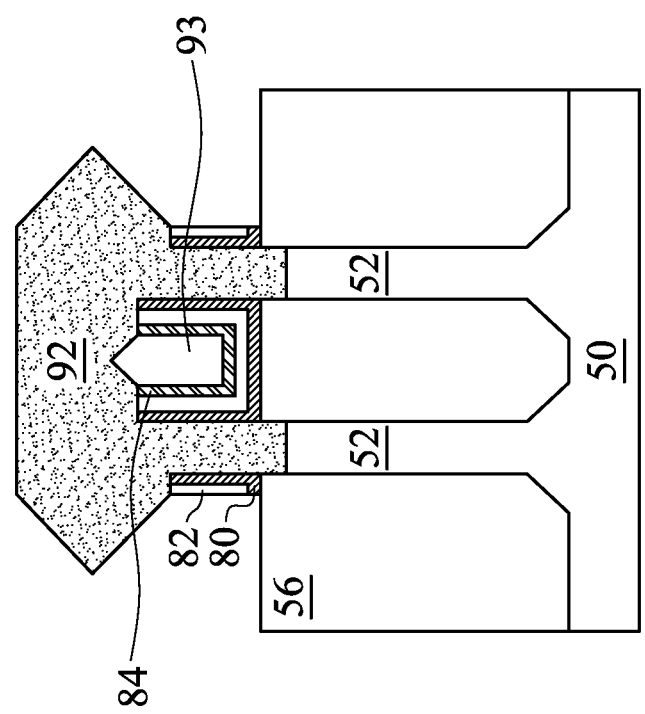
Figure 11E:
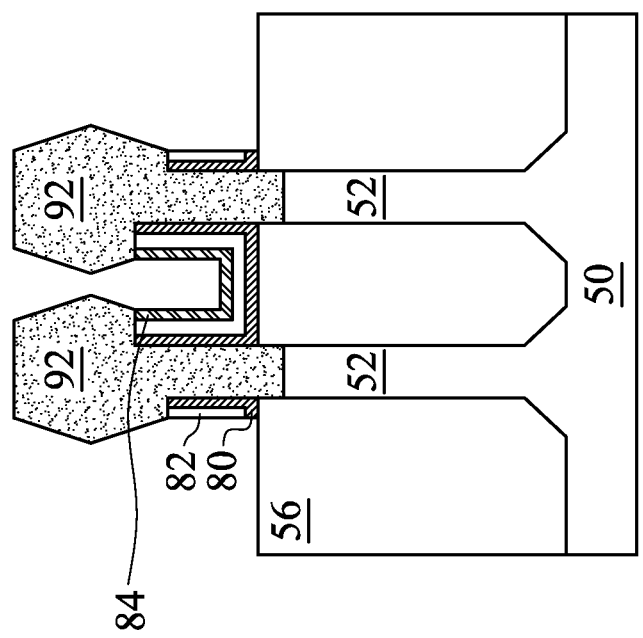
Figure 12B:
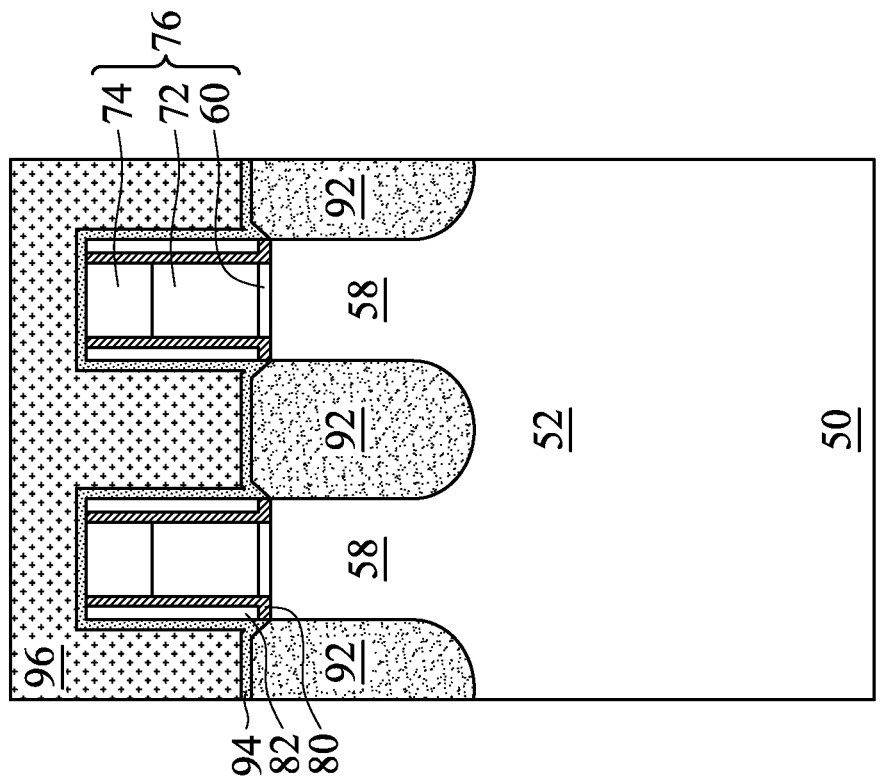
Figure 12A:
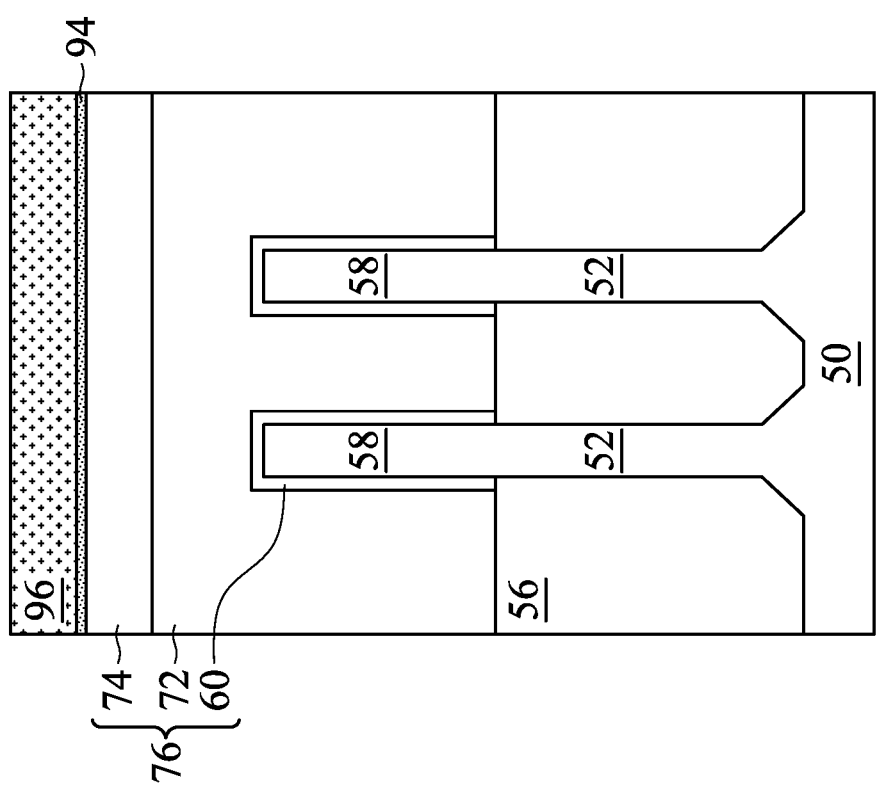
Figure 12C:
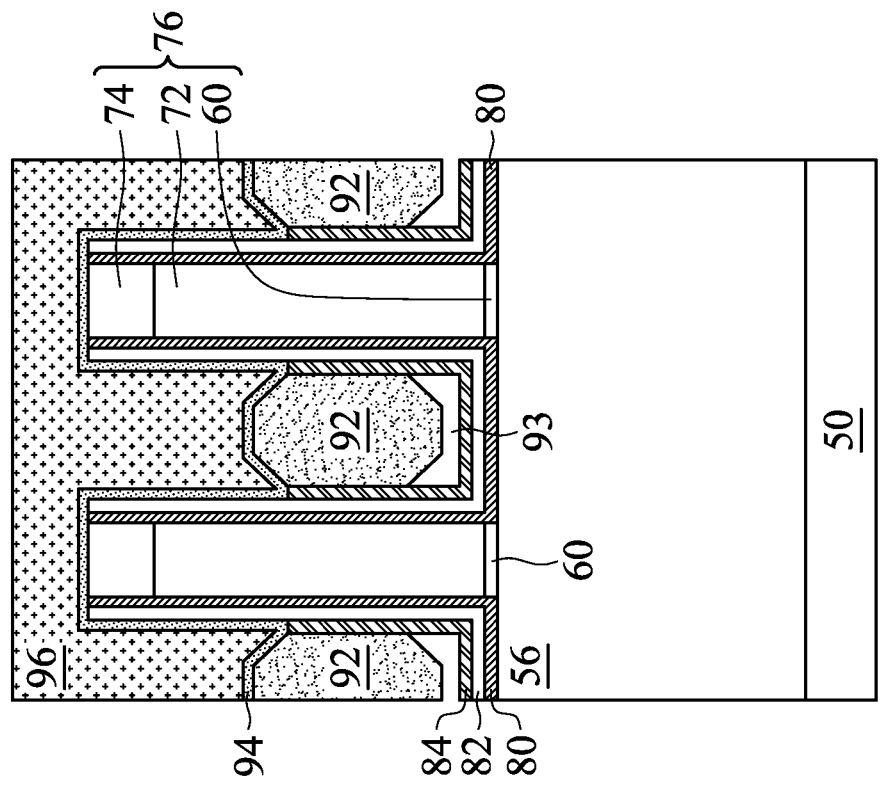
Figure 12D:
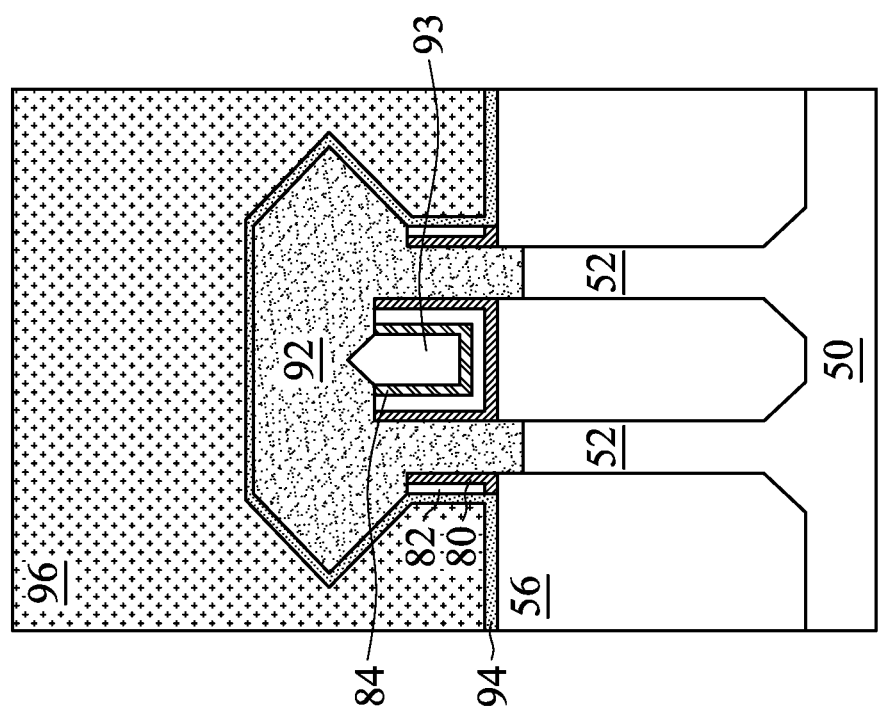
Figure 13B:
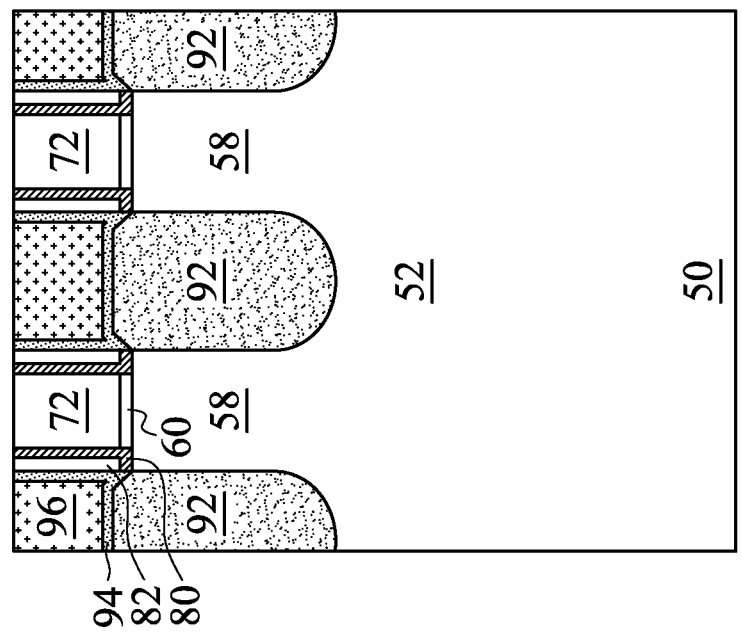
Figure 13A:
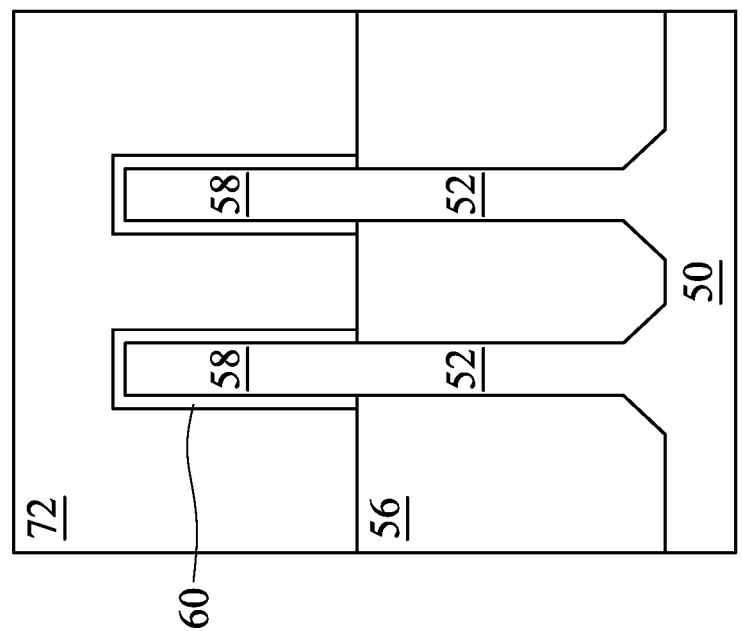
Figure 13C:
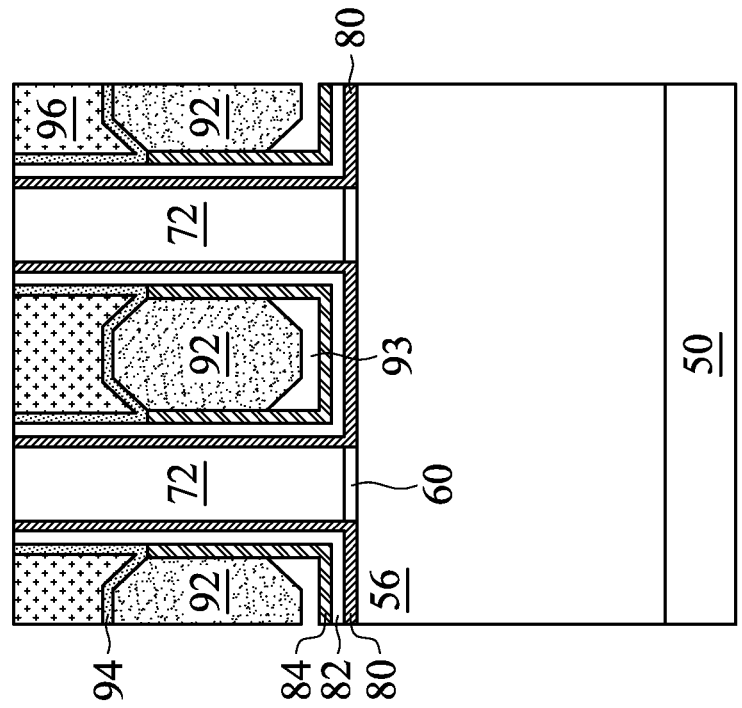
Figure 13D:
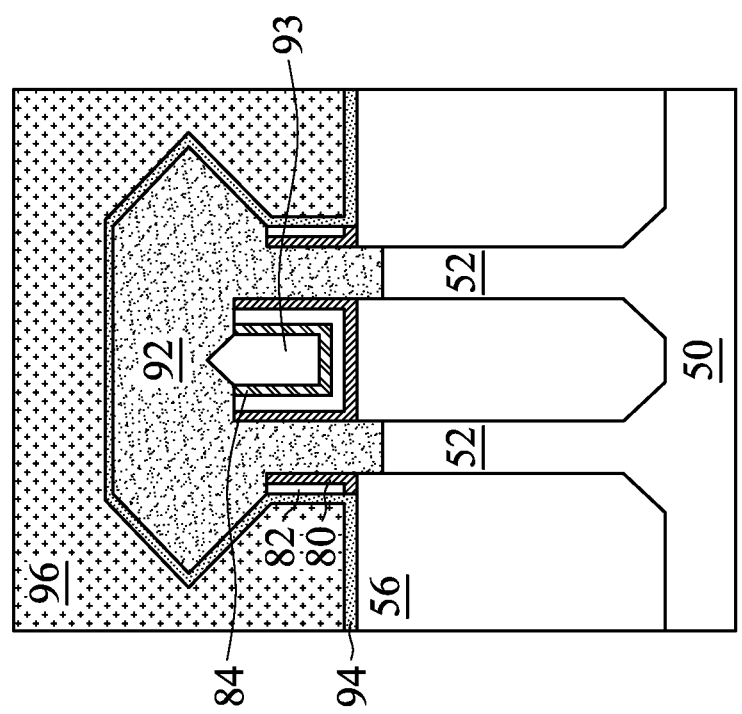
Figure 14B:
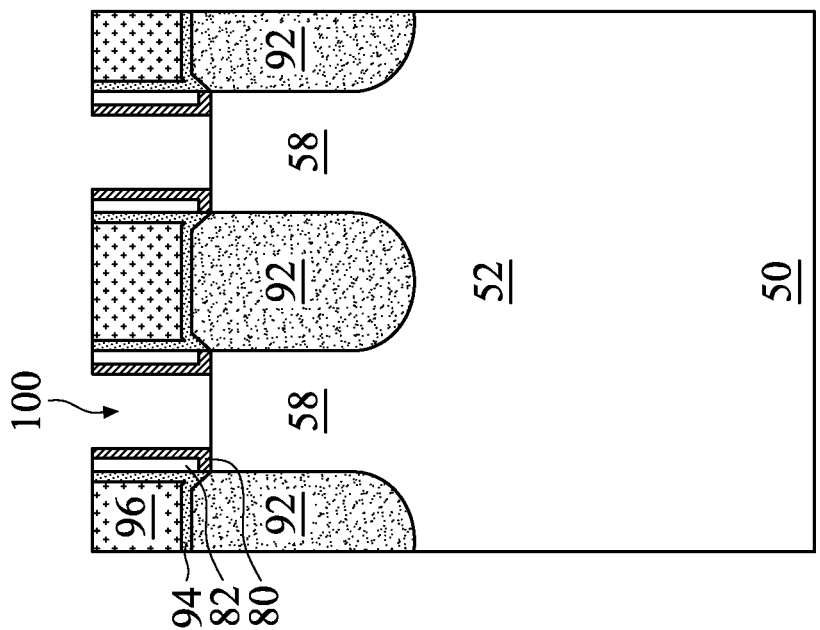
Figure 14A:
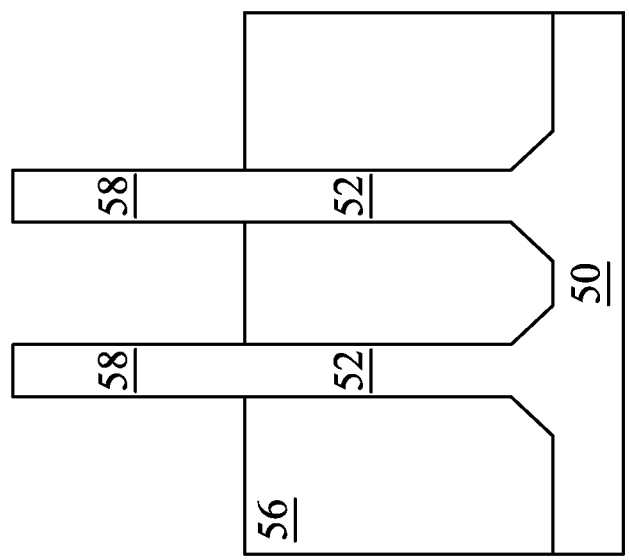
Figure 14C:
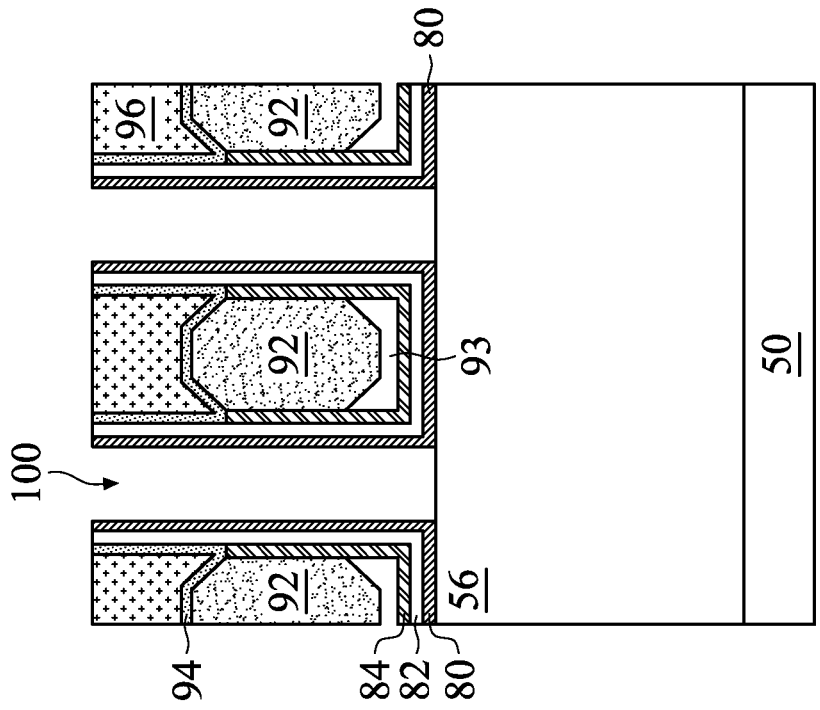
Figure 14D:
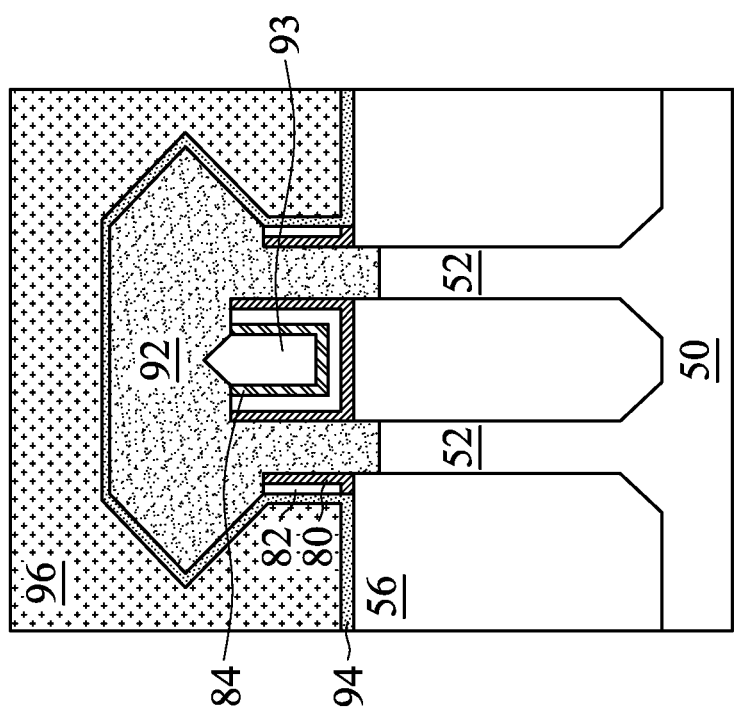

As a result of the epitaxy processes used to form the epitaxial source/drain regions 92 in the region 50N and the region 50P, upper surfaces of the epitaxial source/drain regions have facets which expand laterally outward beyond sidewalls of the fins 52. In some embodiments, these facets cause adjacent epitaxial source/drain regions 92 of a same FinFET to merge as illustrated by FIG. 11C. FIG. 11D illustrated a cross-sectional view of the merged portions of the epitaxial source/drain regions 92, which, as illustrated, may have a generally round shape, such as a circular shape or an oval shape. As illustrated in FIGS. 11C and 11D, portions of the residual portions of the first gate spacers 80, the second gate spacers 82, and the third gate spacers 84 may be disposed below the merged portions of the epitaxial source/drain regions 92. In other embodiments, such as the embodiment illustrated in FIG. 11E, adjacent epitaxial source/drain regions 92 remain separated after the epitaxy process is completed.

As further illustrated in FIGS. 11C and 11D, voids 93 may be formed below the epitaxial source/drain regions 92, between the epitaxial source/drain regions and the third gate spacers 84. The voids 93 may be formed as a result of the selective epitaxial growth processes used to form the epitaxial source/drain regions 92. As will be discussed in greater detail below, the voids 93 may become part of gas spacers (e.g., the gas spacers 110 discussed in reference to FIGS. 20A-20D).

In FIGS. 12A-12D, a first ILD 96 is deposited over the structure illustrated in FIGS. 11A-11D. The first ILD 96 may be formed of a dielectric material, and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. Other insulation materials formed by any acceptable process may be used.

In some embodiments, a first contact etch stop layer (CESL) 94 is disposed between the first ILD 96 and the epitaxial source/drain regions 92, the masks 74, the first gate spacers 80, the second gate spacers 82, and the third gate spacers 84. The first CESL 94 may comprise an insulating material, such as SiN, SiCN, SiON, multiple layers or a combination thereof, or the like. The first CESL 94 may be deposited by a conformal deposition method, such as CVD, ALD, or the like. The first CESL 94 may be formed of a material having a different etch selectivity from the material of the second gate spacers 82 and the third gate spacers 84. As such, the second gate spacers 82 and the third gate spacers 84 may be removed without removing the first CESL 94. In some embodiments, the first CESL 94 may be formed of the same material as the first gate spacers 80.

In FIGS. 13A-13D, a planarization process, such as a CMP, may be performed on the first ILD 96. In some embodiments, the planarization process may be used to level a top surface of the first ILD 96 with top surfaces of the dummy gates 72. In further embodiments, the planarization process may be used to level the top surface of the first ILD 96 with top surfaces of the masks 74. The planarization process may also be used to remove portions of the first CESL 94, the first gate spacers 80, and the second gate spacers 82 such that, following the planarization process, the top surface of the first ILD 96 may also be level with top surfaces of the first CESL 94, the first gate spacers 80, and the second gate spacers 82.

In FIGS. 14A-14D, the dummy gates 72, and the masks 74, if present, are removed in an etching step(s), so that recesses 100 are formed. Portions of the dummy dielectric layer 60 underlying the dummy gates 72 may also be removed. In some embodiments, only the dummy gates 72 are removed and the dummy dielectric layer 60 remains and is exposed by the recesses 100. In some embodiments, the dummy dielectric layer 60 is removed from recesses 100 in a first region of a die (e.g., a core logic region) and remains in recesses 100 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 96, the first CESL 94, the first gate spacers 80, or the second gate spacers 82. Each recess 100 exposes a channel region 58 of a respective fin 52. Each channel region 58 is disposed between neighboring pairs of the epitaxial source/drain regions 92. During the removal, the dummy dielectric layer 60 may be used as an etch stop layer when the dummy gates 72 are etched. The dummy dielectric layer 60 may then be optionally removed after the removal of the dummy gates 72.

Figure 15B:
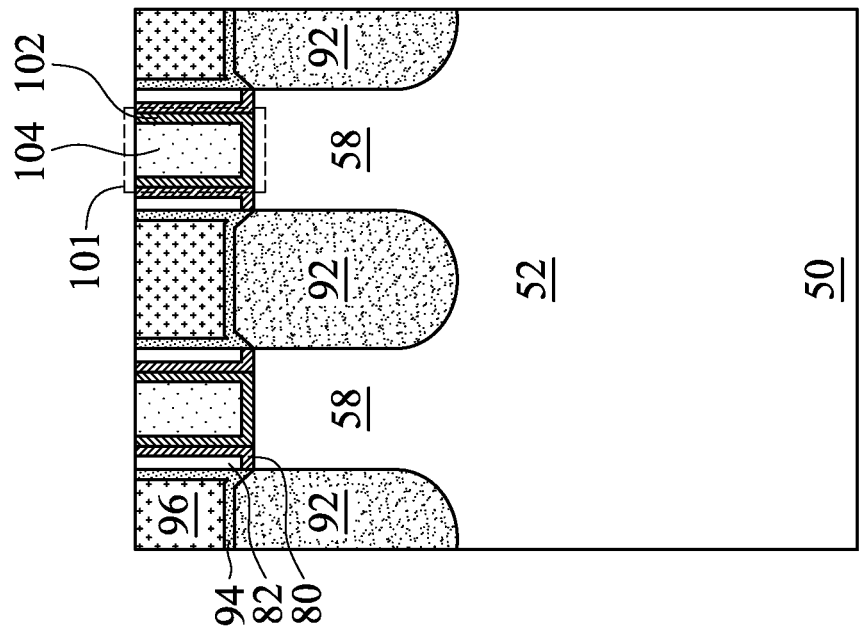
Figure 15A:
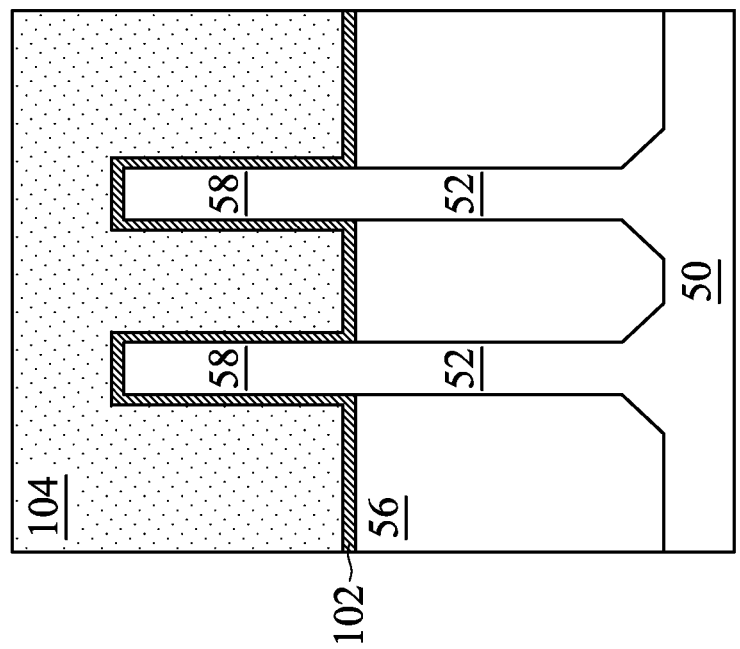
Figure 15C:
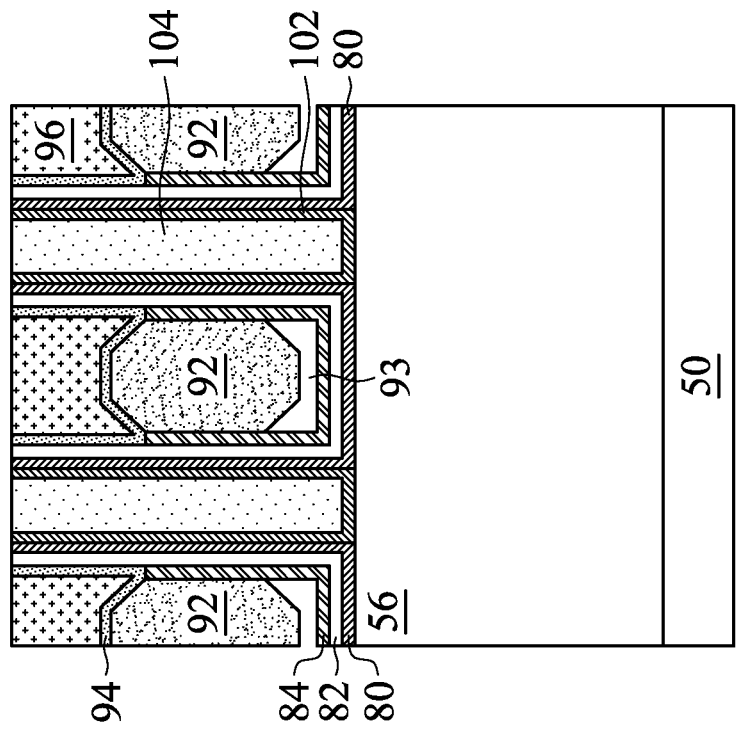
Figure 15D:
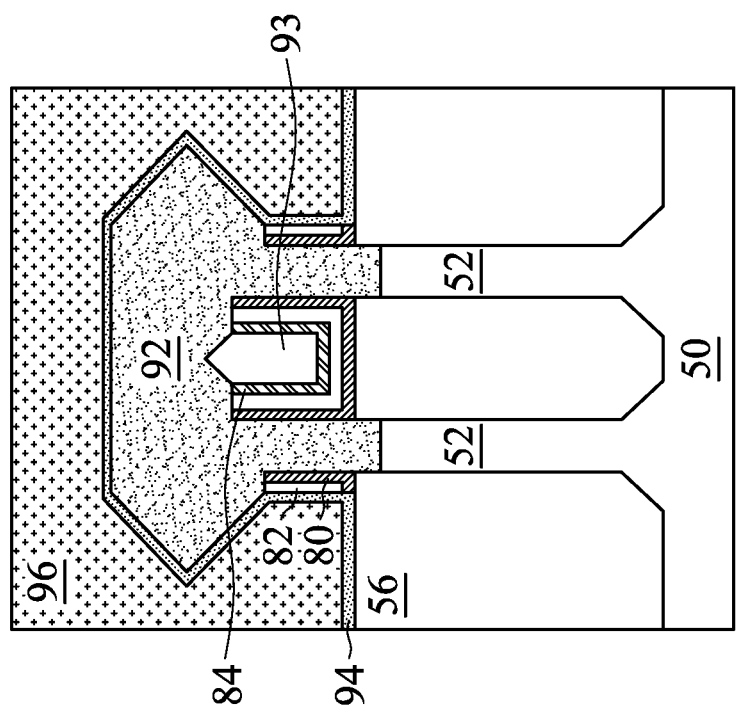
Figure 15E:
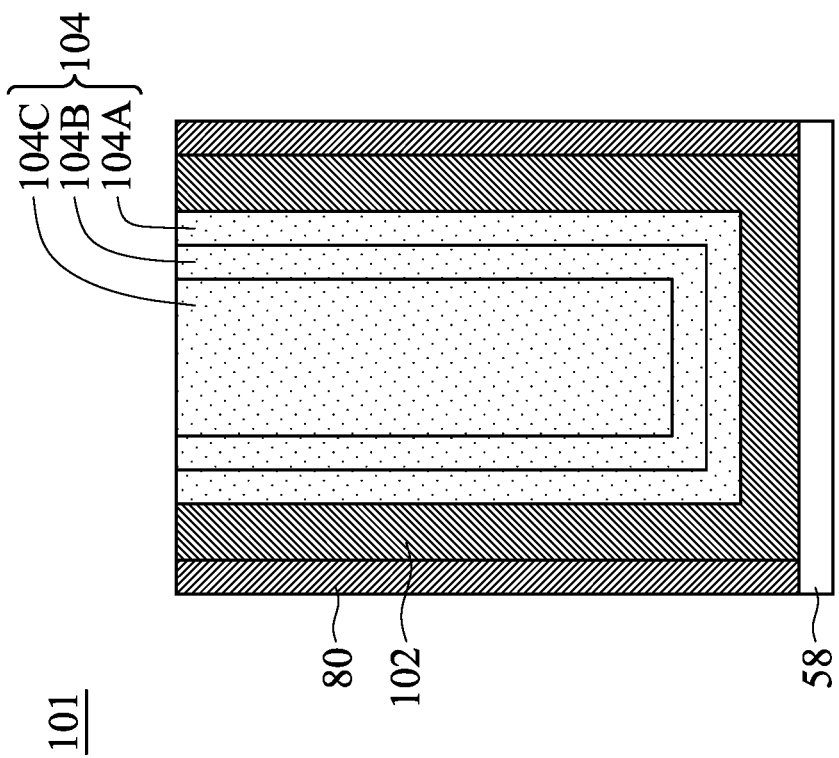

In FIGS. 15A-15E, gate dielectric layers 102 and gate electrodes 104 are formed for replacement gates. FIG. 15E illustrates a detailed view of region 101 of FIG. 15B. Gate dielectric layers 102 are deposited conformally in the recesses 100 (illustrated in FIGS. 15B and 15D), such as on the top surfaces and the sidewalls of the fins 52 and on sidewalls of the first gate spacers 80. The gate dielectric layers 102 may also be formed on top surfaces of the hard mask 98, the first CESL 94, and STI regions 56. In accordance with some embodiments, the gate dielectric layers 102 comprise silicon oxide, silicon nitride, or multilayers thereof. In some embodiments, the gate dielectric layers 102 include a high-k dielectric material, and in these embodiments, the gate dielectric layers 102 may have a k value greater than about 7.0, and may include a metal oxide or a silicate of Hf, Al, Zr, La, Mg, Ba, Ti, Pb, and combinations thereof. The formation methods of the gate dielectric layers 102 may include molecular-beam deposition (MBD), ALD, PECVD, and the like. In embodiments where portions of the dummy dielectric layer 60 remain in the recesses 100, the gate dielectric layers 102 include a material of the dummy dielectric layer 60 (e.g., SiO$_2$).

The gate electrodes 104 are deposited over the gate dielectric layers 102, respectively, and fill the remaining portions of the recesses 100. The gate electrodes 104 may include a metal-containing material such as TiN, TiO, TaN, TaC, Co, Ru, Al, W, combinations thereof, or multi-layers thereof. For example, although a single layer gate electrode 104 is illustrated in FIGS. 15A, 15B, and 15D, the gate electrode 104 may comprise any number of liner layers 104A, any number of work function tuning layers 104B, and a fill material 104C as illustrated by FIG. 15E. After the filling of the gate electrodes 104, a planarization process, such as a CMP, may be performed to remove the excess portions of the gate dielectric layers 102 and the material of the gate electrodes 104, which excess portions are over the top surface of the hard mask 98. The remaining portions of material of the gate electrodes 104 and the gate dielectric layers 102 thus form replacement gates of the resulting FinFETs. The gate electrodes 104 and the gate dielectric layers 102 may be collectively referred to as a "gate stacks." The gate and the gate stacks may extend along sidewalls of a channel region 58 of the fins 52. The gate stacks may have a gate height from about 10 nm to about 60 nm, such as about 40 nm.

The formation of the gate dielectric layers 102 in the region 50N and the region 50P may occur simultaneously such that the gate dielectric layers 102 in each region are formed from the same materials, and the formation of the gate electrodes 104 may occur simultaneously such that the gate electrodes 104 in each region are formed from the same materials. In some embodiments, the gate dielectric layers 102 in each region may be formed by distinct processes, such that the gate dielectric layers 102 may be different materials, and/or the gate electrodes 104 in each region may be formed by distinct processes, such that the gate electrodes 104 may be different materials. Various masking steps may be used to mask and expose appropriate regions when using distinct processes.

Figure 16B:
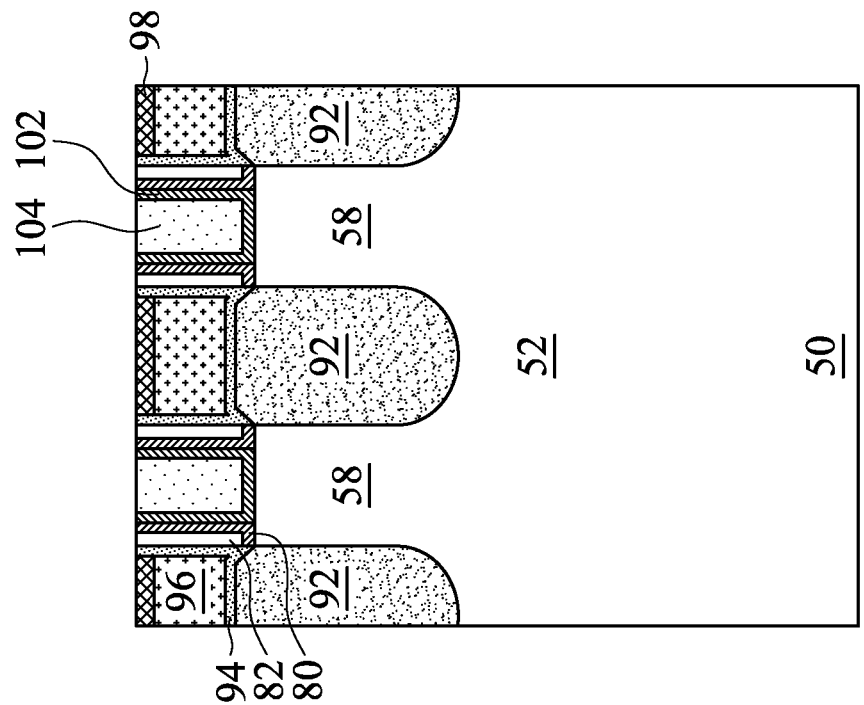
Figure 16A:
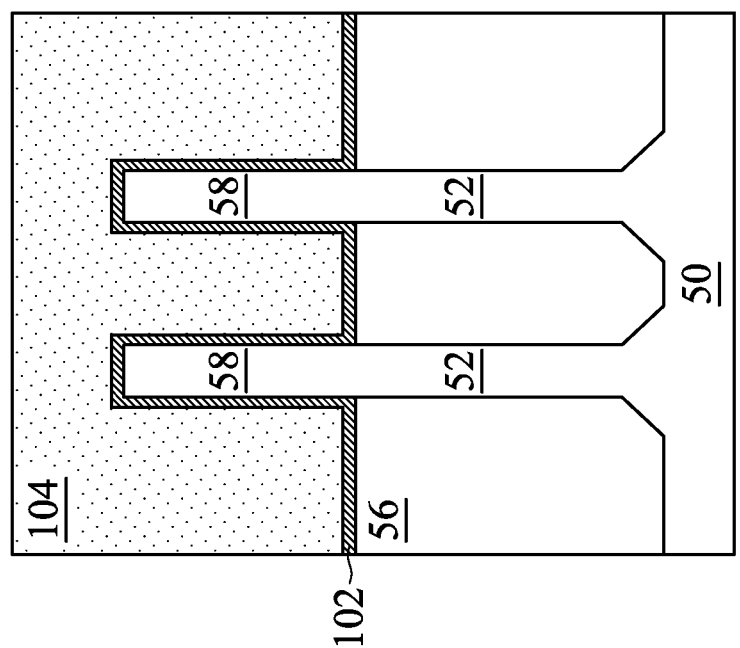
Figure 16C:
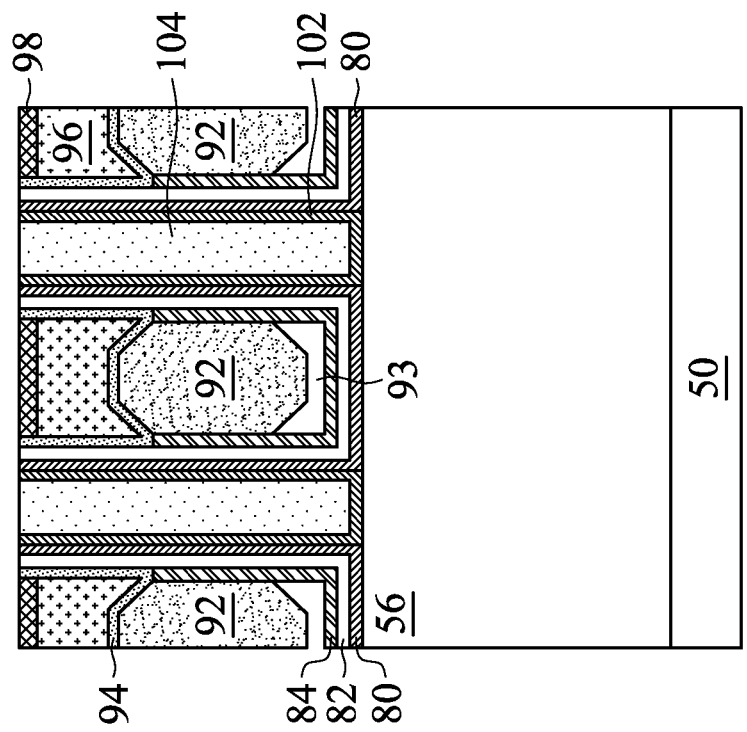
Figure 16D:
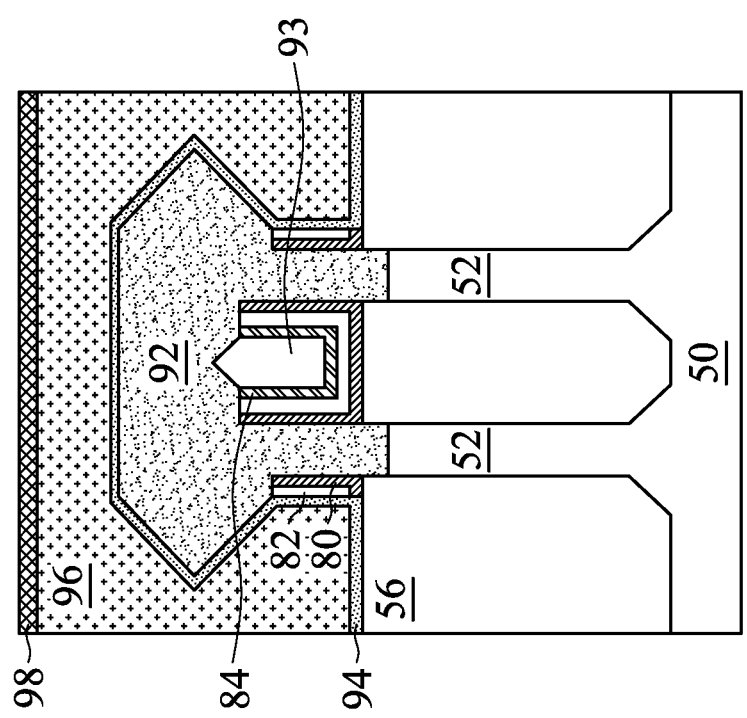

In FIGS. 16A-16D, the first ILD 96 is etched back and a hard mask 98 is formed over the first ILD 96. The first ILD 96 may be etched back using an anisotropic etch process, such as RIE, NBE, or the like, or an isotropic etch process, such as a wet etch process. The first ILD 96 may be etched back by a distance relative to the height of the gate stacks, such as from about ¹⁄₁₀ to about ½ of the height of the gate stacks. The hard mask 98 may then be deposited over the resulting structure using CVD, PECVD, ALD, sputtering, or the like, and planarized using a process such as CMP. As illustrated in FIGS. 16B and 16D, following the planarization of the hard mask 98, top surfaces of the hard mask 98 may be level with top surfaces of the first CESL 94, the first gate spacers 80, the second gate spacers 82, the gate dielectric layers 102, and the gate electrodes 104. The planarization process used to planarize the hard mask 98 may also planarize the gate dielectric layers 102 and the gate electrodes 104 such that a height of the gate stacks following the planarization is from about 10 nm to about 50 nm. The hard mask 98 may be formed of a material such as silicon nitride, silicon oxide, silicon oxycarbide, silicon carbonitride, combinations or multiple layers thereof, or the like. The hard mask 98 may be formed over the first ILD 96 in order to protect the first ILD 96 from the etching process used to remove the second gate spacers 82 and the third gate spacers 84 (discussed below in reference to FIGS. 17A-18D).

FIGS. 17A-17D illustrate an intermediate stage in the removal of the second gate spacers 82 and the third gate spacers 84, the completion of which is illustrated in FIGS. 18A-18E. Although not separately illustrated in FIGS. 17A-17D, the etching process may etch through the second gate spacers 82 to expose the third gate spacers 84, and may then etch the third gate spacers 84. The etching process may be an isotropic etch process. The etching process may use an etching solution which includes an etchant species and a catalyst species. The etchant species may include hydrogen fluoride or the like. The catalyst species may include water, ethanol, combinations thereof, or the like. The etchant species may be supplied at a flow rate from about 50 SCCM to about 700 SCCM. In an embodiment in which the catalyst species comprises water, the catalyst species may be supplied at a flow rate from about 300 milligrams/minute (MGM) to about 1800 MGM. In an embodiment in which the catalyst species comprises ethanol, the catalyst species may be supplied at a flow rate from about 100 SCCM to about 800 SCCM. The etchant species and the catalyst species may be supplied as liquids, gases, or the like. In specific embodiments, the etchant species may be supplied as gases and the catalyst species may be supplied as liquids.

The entire structure illustrated in FIGS. 16A-16D may be exposed to the etching solution. The etching process may be carried out in a processing chamber at a low temperature, such as a temperature below 0° C., a temperature from about −30° C. to about 30° C., a temperature from about −30° C. to about 0° C., a temperature of about −20° C., or the like. The processing chamber may be maintained at a pressure from about 1 Torr to about 20 Torr. As illustrated in FIG. 17A, the etching solution may form a solid etch film 106 along surfaces of the hard mask 98, the first CESL 94, the first gate spacers 80, the gate dielectric layers 102, and the gate electrodes 104. The etching solution may form a liquid etch film 108 along surfaces of the second gate spacers 82 and the third gate spacers 84. The etchant species as well as intermediate products formed by etching the second gate spacers 82 and the third gate spacers 84 may reduce the freezing point of the etching solution such that the etching solution only forms the liquid etch film along surfaces of the second gate spacers 82 and the third gate spacers 84 where the intermediate products are present. The temperature during the etching process and the flow rates of the etchant species and the catalyst species may be controlled in order to control the phases present at surfaces of the structure to be etched (e.g., to control the extent of the solid etch film 106 and the liquid etch film 108).

Performing the etching process at the low temperature such that the etching solution forms the solid etch film 106 and the liquid etch film 108 may reduce the etch rates of structures intended to be kept relative to the etch rates of the second gate spacers 82 and the third gate spacers 84. For example, performing the etching process at the low temperature may decrease the etch rates of the hard mask 98, the first gate spacers 80, the gate dielectric layers 102, the gate electrodes 104, the first CESL 94, and the epitaxial source/drain regions 92 (e.g., structures along which the solid etch film 106 is disposed) relative to the etch rates of the second gate spacers 82 and the third gate spacers 84 (e.g., structures along which the liquid etch film 108 is disposed). Specifically, the presence of the solid etch film 106 along surfaces of the hard mask 98, the first gate spacers 80, the gate dielectric layers 102, the gate electrodes 104, the first CESL 94, and the epitaxial source/drain regions 92 may reduce removal of any products etched from the hard mask 98, the first gate spacers 80, the gate dielectric layers 102, the gate electrodes 104, the first CESL 94, or the epitaxial source/drain regions 92. This increases the etch selectivity of the etching process and reduces the loss of material from the hard mask 98, the first gate spacers 80, the gate dielectric layers 102, the gate electrodes 104, the first CESL 94, and the epitaxial source/drain regions 92 caused by the etching process. Using the etching process may also reduce damage to the gate stacks, such as profile bending and the like. This improves performance and reduces defects in completed semiconductor devices made from the above-described methods.

The etching process may have high etch rates for materials including silicon nitride, silicon oxide, silicon oxycarbonitride, and the like. The etching process may have low etch rates for materials including titanium nitride, $TiNO_x$, tungsten, $WO_x$, silicon carbonitride, silicon, silicon germanium, silicon phosphide, and the like. Performing the etching process at the low temperature may decrease the etch rate of at least silicon carbonitride, titanium nitride, $TiNO_x$, and $WO_x$. In specific embodiments in which the gate dielectric layers 102 and/or the gate electrodes 104 comprise metal oxides, the material of the gate dielectric layers 102 and/or the gate electrodes 104 may be removed according to the following reaction:

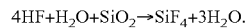

$HF_{(aq)} + H_2O + MO_2 \rightarrow MF_x(OH)_y,$ wherein M represents a metal material of the gate dielectric layers 102 and/or the gate electrodes 104. Forming the solid etch film 106 along the gate dielectric layers 102 and the gate electrodes 104 may reduce the removal of $MF_x$, thereby reduces the removal of material from the gate dielectric layers 102 and/or the gate electrodes 104.

In an embodiment in which the second gate spacers 82 and the third gate spacer 84 comprise silicon oxide, the etchant species comprises hydrogen fluoride, and the catalyst species comprises water, the second gate spacers 82 and the third gate spacers 84 may be removed according to the following reaction:

$4HF + H_2O + SiO_2 \rightarrow SiF_4 + 3H_2O.$

As such, etching the second gate spacers and the third gate spacers may produce water. If the concentration of water in the etching solution becomes too high, the etching solution may freeze and the excess water may make it difficult to control the etching process. As such, the etching process may be cyclic with the etching solution being removed from the processing chamber periodically (e.g., to remove excess water) using a purge following each etch cycle. The etching solution may be heated during the purging process in order to prevent the etching solution from freezing. In some embodiments, from one to three etch cycles may be used to etch the second gate spacers 82 and the third gate spacers 84. The etching process may remove the second gate spacers 82 and the third gate spacers 84 from one of the region 50N or the region 50P more quickly than from the other of the region 50N or the region 50P. The etching may proceed for a duration sufficient to completely remove the second gate spacers 82 and the third gate spacers 84 from both the region 50N and the region 50P, such as from about 40 seconds to about 200 seconds, such as about 120 seconds.

Although the second gate spacers 82 and the third gate spacers 84 have been described as being removed after forming the replacement gates, in some embodiments, the second gate spacers 82 and the third gate spacers 84 may be removed prior to forming the replacement gates. For example, the hard mask 98 may be formed and the second gate spacers 82 and the third gate spacers 84 may be removed after the processes described above with respect to FIGS. 13A-13D are performed and before the processes described with respect to FIGS. 14A-14D are performed. The above-described selective etching process may be used to remove the second gate spacers 82 and the third gate spacers 84 such that minimal material is removed from the dummy gates 72, the hard mask 98, the first gate spacers 80, the first CESL 94, and the epitaxial source/drain regions 92.

In FIGS. 18A-18E, a first dielectric layer 112 is formed over the structure of FIGS. 17A-17D, which forms gas spacers 110 by enclosing openings formed by removing the second gate spacers 82 and the third gate spacers 84. The first dielectric layer 112 may be formed by a conformal deposition process, such as CVD, ALD, or the like. In specific embodiments, the first dielectric layer 112 may be deposited by a process having low conformity, such as physical vapor deposition (PVD). The first dielectric layer 112 may comprise a dielectric material, such as, silicon nitride, silicon oxide, silicon oxycarbide, silicon carbonitride, or the like. Although bottom surfaces of the first dielectric layer 112 are illustrated as being flat, the bottom surfaces of the first dielectric layer 112 may be curved. For example, in some embodiments, the bottom surfaces of the first dielectric layer 112 may be convex or concave.

Because the first dielectric layer 112 may be deposited using a process having poor conformity, the first dielectric layer 112 may extend only partially into the openings formed by the removal of the second gate spacers 82 and the third gate spacers 84. The first dielectric layer 112 may extend a depth into the openings greater than a thickness of the hard mask 98 such that portions of the first dielectric layer 112 remain after the hard mask 98 is removed by a process such as planarization (as discussed below in reference to FIGS. 19A-19D). For example, bottom surfaces of the first dielectric layer 112 may be disposed below bottom surfaces of the hard mask 98 by a distance of up to about 30 nm. Because portions of the openings remain unfilled by the first dielectric layer 112, the gas spacers 110 are formed underlying the first dielectric layer 112, between the first gate spacers 80 and the first CESL 94. The gas spacers 110 may comprise any gas present in the reaction chamber when the first dielectric layer 112 is deposited. According to an embodiment, the gas spacers 110 may comprise air. In some embodiments, the gas spacers 110 may comprise nitrogen ($N_2$), argon (Ar), xenon (Xe), ammonia ($NH_3$), chlorine ($Cl_2$), combinations thereof, or the like. In some embodiments, the gas spacers 110 may further comprise precursor gases used to form the first dielectric layer 112, including silane ($SiH_4$), dichlorosilane ($SiH_2Cl_2$), silicon tetrachloride ($SiCl_4$), ammonia, combinations thereof, or the like. In various embodiments, the first dielectric layer 112 may be deposited by a deposition process in a vacuum or a partial vacuum with a pressure from about 10 Torr to about 15 Torr, such as about 12.5 Torr. As such, the gas spacers 110 may have a low pressure from about 10 Torr to about 15 Torr, such as about 12.5 Torr. The gas spacers 110 may have a width Wi adjacent the gate stacks from about 1.5 nm to about 3 nm and a height $H_1$ from of less than about 90 nm. The gas spacers 110 may have a dielectric constant (e.g., a k value) of 1 or close to 1.

The gas spacers 110 have a low k-value of 1 or close to 1, which is lower than the k-value of the second gate spacers 82 or the third gate spacers 84, which may be formed of silicon oxide, silicon nitride, silicon oxycarbonitride, or the like, as discussed above. Replacing the third gate spacers 84 and the second gate spacers 82 with the gas spacers 110 decreases the overall effective k-value of the spacers (e.g., the combination of the gas spacers 110 and the first gate spacers 80) and lowers the parasitic capacitance in devices formed according to the above-described methods. This may increase the circuit speed, reliability, and overall device performance of devices formed according to the above-described methods.

FIG. 18E illustrates a cross-sectional view parallel to a major surface of the substrate 50. As illustrated in FIG. 18E, portions of the gas spacers 110 may encircle portions of the first CESL 94 and the first ILD 96. The gas spacers 110 may be encircled by the first gate spacers 80. The first CESL 94 and the first ILD 96 may not be present between adjacent epitaxial source/drain regions 92, such as below merged portions of the epitaxial source/drain regions 92.

FIG. 18E further illustrates that some of the gate electrodes 104 may be cut. In an embodiment, dummy gates 72 and masks 74 may be etched after the processes discussed with respect to FIGS. 10A-10D are performed. A patterned mask, such as a patterned photoresist, may be formed over the structures illustrated in FIGS. 10A-10D. The patterned photoresist may be formed by depositing a photoresist layer over the structure illustrated in FIGS. 10A-10D using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the patterned photoresist. The dummy gates 72, the masks 74, the first gate spacers 80, the second gate spacers 82, and the third gate spacers 84 are then etched using a suitable etch process, such as an anisotropic etch process (e.g., a dry etch process) or the like. The first ILD 96 may be deposited in recesses left by etching the dummy gates 72, the masks 74, the first gate spacers 80, the second gate spacers 82, and the third gate spacers 84 using the processes discussed with respect to FIGS. 12A-12D. The dummy gates 72 or the gate electrodes 104 may be cut at any suitable point or by any suitable method in order to form the cut gate electrodes 104 illustrated in FIG. 18E.

In FIGS. 19A-19D, the first dielectric layer 112 is planarized and the hard mask 98 is removed. The first dielectric layer 112 may be planarized by a process such as CMP. Portions of the first dielectric layer 112 disposed above the first ILD 96, the first CESL 94, the first gate spacers 80, the gate dielectric layers 102, and the gate electrodes 104 may be removed and, following the planarization, top surfaces of the first dielectric layer 112 and the gate stacks may be level with top surfaces of the first ILD 96. The planarization process may further remove the hard mask 98. As discussed previously, the first dielectric layer 112 may be deposited in the openings left by removing the second gate spacers 82 and the third gate spacers 84 to a greater depth than the thickness of the hard mask 98 such that the first dielectric layer 112 remains after the hard mask 98 is removed by the planarization process. Following the planarization, a height of the gate stacks may be from about 10 nm to about 30 nm. Although top surfaces of the first dielectric layer 112 are illustrated as being flat, the top surfaces of the first dielectric layer 112 may be curved after the planarization process. For example, in some embodiments, the top surfaces of the first dielectric layer 112 may be convex or concave.

Figure 20D:
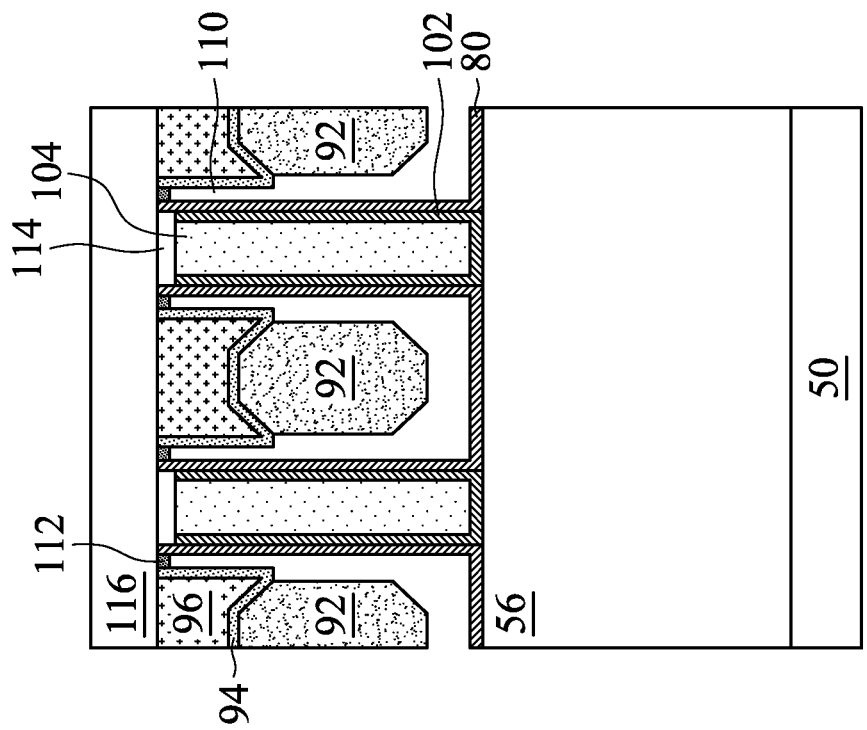
Figure 20C:
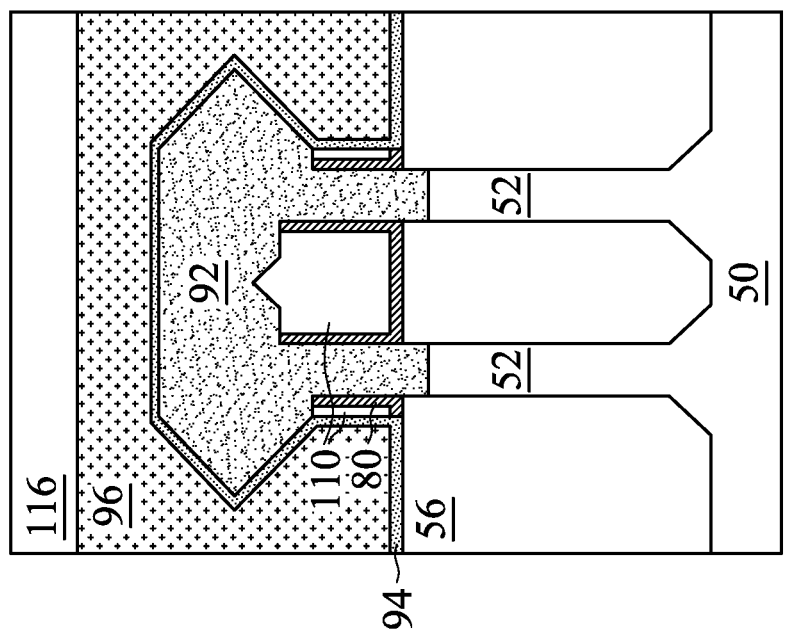
Figure 21B:
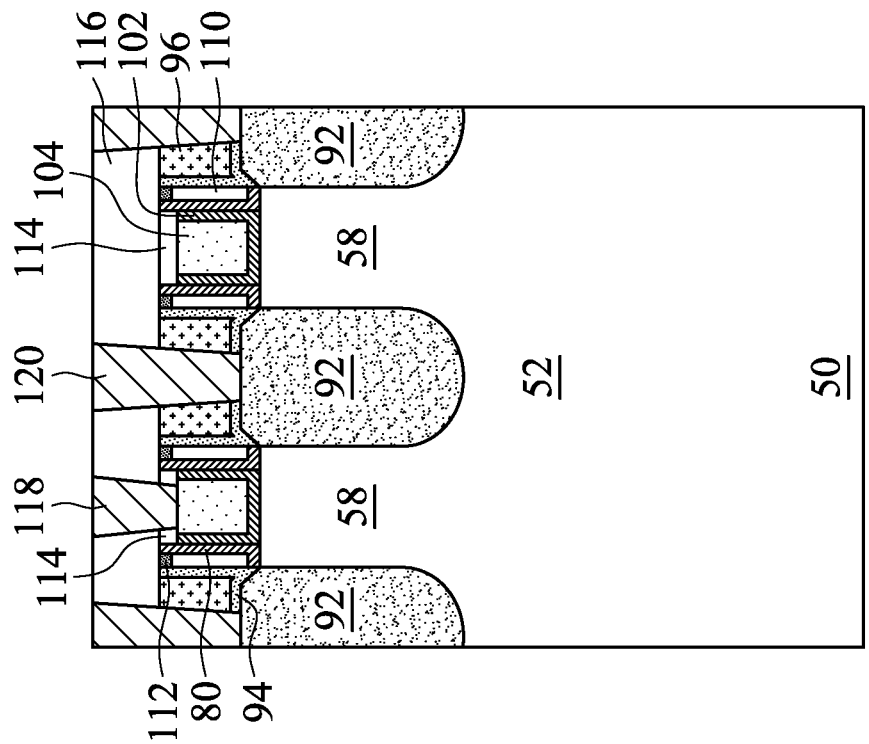
Figure 21A:
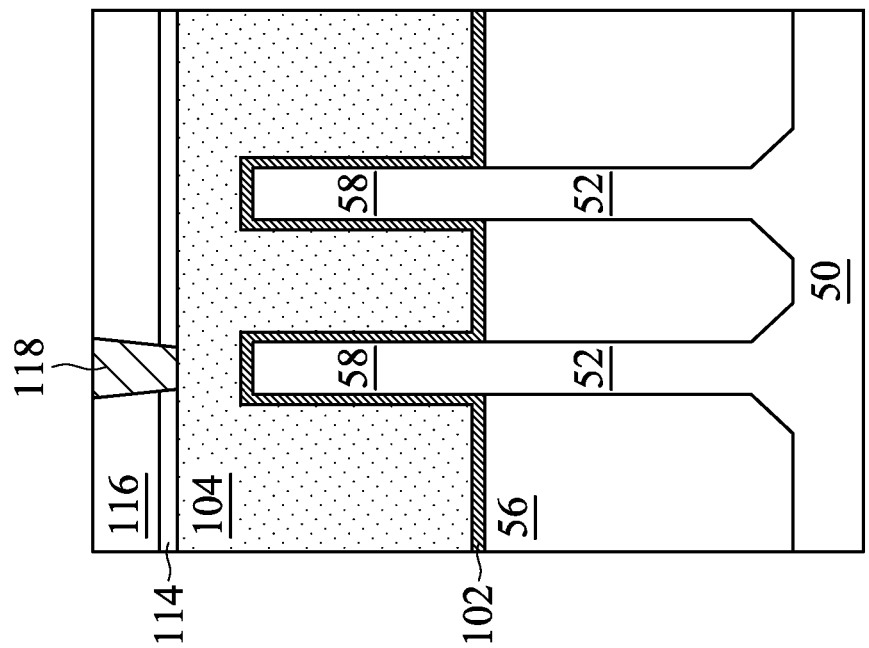
Figure 21D:
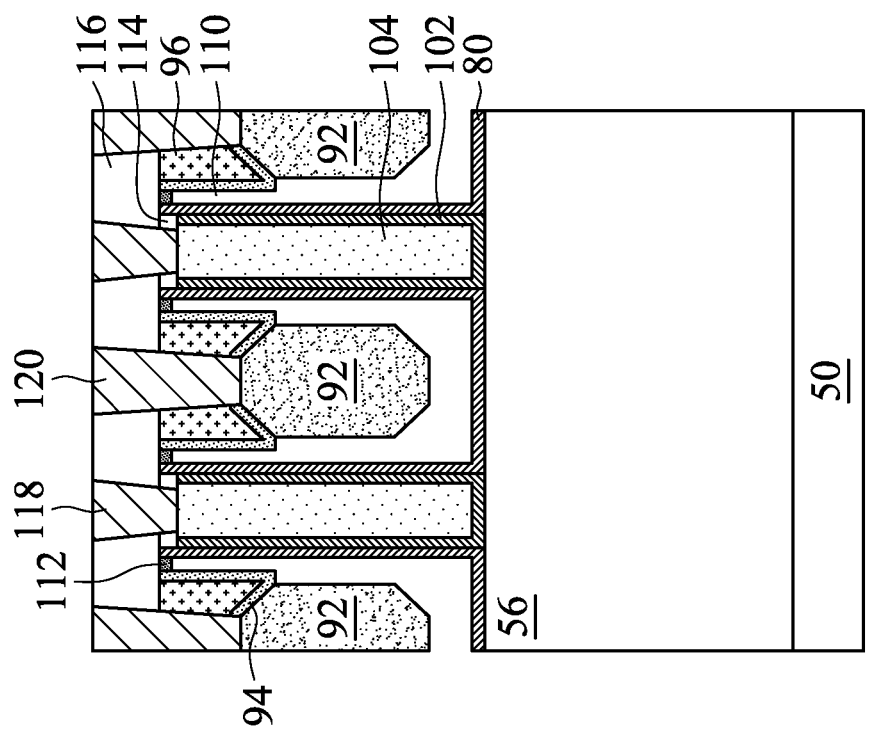
Figure 21C:
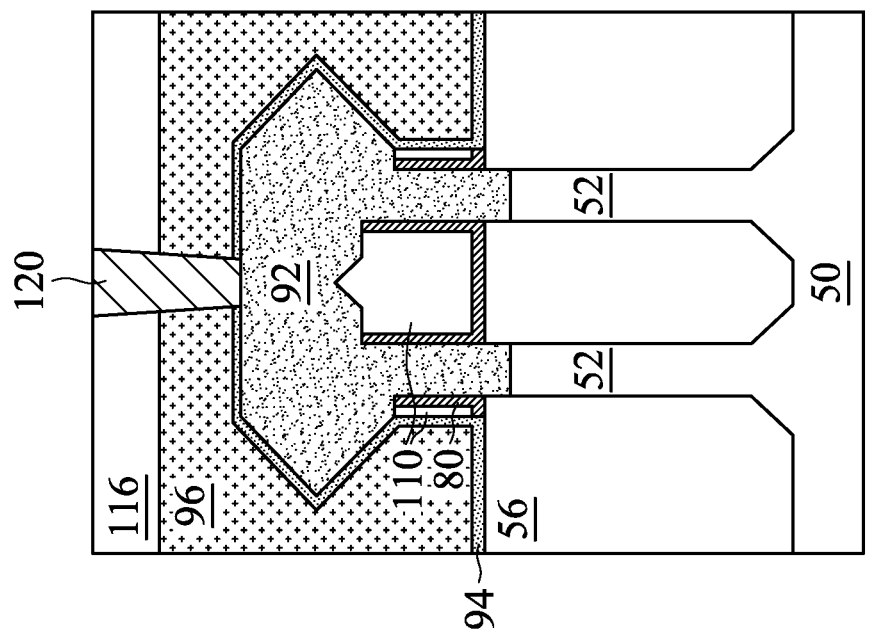

In FIGS. 20A-20D, a second ILD 116 is deposited over the first ILD 96, the gate electrodes 104, the gate dielectric layers 102, the first CESL 94, the first dielectric layer 112, and the first gate spacers 80. In some embodiments, the second ILD 116 is a flowable film formed by a flowable CVD method. The second ILD 116 may be formed of a dielectric material such as PSG, BSG, BPSG, USG, or the like, and may be deposited by any suitable method, such as CVD and PECVD. In accordance with some embodiments, before the formation of the second ILD 116, the gate stacks (including the gate dielectric layers 102 and the gate electrodes 104) are recessed, so that a recess is formed directly over the gate stacks and between opposing portions of the first gate spacers 80, as illustrated in FIGS. 20A and 20B. A gate mask 114 comprising one or more layers of dielectric material, such as silicon nitride, silicon oxynitride, or the like, is filled in the recess, followed by a planarization process to remove excess portions of the dielectric material extending above the first ILD 96. The subsequently formed gate contacts (e.g., gate contacts 118 described below in reference to FIGS. 21A-21D) penetrate through the gate mask 114 to contact top surfaces of the recessed gate electrodes 104.

In FIGS. 21A-21D, gate contacts 118 and source/drain contacts 120 are formed through the second ILD 116 and the first ILD 96, in accordance with some embodiments. Openings for the source/drain contacts 120 are formed through the second ILD 116, the first ILD 96, and the first CESL 94, and openings for the gate contacts 118 are formed through the second ILD 116 and the gate mask 114. The openings may be formed using acceptable photolithography and etching techniques. The openings may be formed in a controlled manner to avoid exposing the gas spacers 110. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. The gate contacts and the source/drain contacts may be deposited by a process such as physical vapor deposition (PVD), CVD, or the like. A planarization process, such as a CMP, may be performed to remove excess material from a surface of the second ILD 116. The remaining liner and conductive material form the source/drain contacts 120 and the gate contacts 118 in the openings. An anneal process may be performed to form a silicide at the interface between the epitaxial source/drain regions 92 and the source/drain contacts 120. The source/drain contacts 120 are physically and electrically coupled to the epitaxial source/drain regions 92, and the gate contacts 118 are physically and electrically coupled to the gate electrodes 104. The source/drain contacts 120 and the gate contacts 118 may be formed in different processes, or may be formed in the same process. Although shown as being formed in the same cross-sections, it should be appreciated that each of the source/drain contacts 120 and the gate contacts 118 may be formed in different cross-sections, which may avoid shorting of the contacts.

As discussed above, forming the gas spacers 110 reduces the effective dielectric constant of the spacers used in the structure of the present application. This reduces parasitic capacitance, which increases circuit speed, reliability, and overall device performance of devices formed according to the above-described methods. Moreover, using the low-temperature etching process to form the gas spacers 110 improves the etch selectivity of the etching process, which allows for the second gate spacers 82 and the third gate spacers 84 to be removed without removing or damaging other structures. This reduces device defects and improves device performance of devices formed according to the above-described methods.

In accordance with an embodiment, a method includes forming a gate stack over a substrate; forming a first gate spacer on sidewalls of the gate stack; forming a second gate spacer on sidewalls of the first gate spacer; removing the second gate spacer using an etching process to form a first opening, the etching process being performed at a temperature less than 0° C., the etching process using an etching solution including hydrogen fluoride; and depositing a dielectric layer over the first gate spacer and the gate stack, the dielectric layer sealing a gas spacer in the first opening. In an embodiment, the etching solution further includes a catalyst, the catalyst including water. In an embodiment, a flow rate of the hydrogen fluoride in the etching solution is from 50 SCCM to 700 SCCM, and a flow rate of the water in the etching solution is from 300 MGM to 1800 MGM. In an embodiment, the etching solution further includes a catalyst, the catalyst including ethanol. In an embodiment, a flow rate of the hydrogen fluoride in the etching solution is from 50 SCCM to 700 SCCM, and a flow rate of the ethanol in the etching solution is from 100 SCCM to 800 SCCM. In an embodiment, the etching process includes from one to three etch cycles, and each of the etch cycles is followed by a purge. In an embodiment, during the etching process, a solid etch film is formed on surfaces of the gate stack and the first gate spacer, and a liquid etch film is formed on surfaces of the second gate spacer.

In accordance with another embodiment, a method includes forming a gate stack over a semiconductor substrate; forming a first gate spacer on sidewalls of the gate stack; forming a second gate spacer on sidewalls of the first gate spacer; epitaxially growing source/drain regions on opposite sides of the gate stack; removing the second gate spacer using an etching process, the removing the second gate spacer forming first openings, during the etching process, a solid etch film being formed on surfaces of the gate stack, the first gate spacer, and the source/drain regions and a liquid etch film being formed on surfaces of the second gate spacer; and depositing a first dielectric layer sealing the first openings and defining a gas spacer on sidewalls of the first gate spacer. In an embodiment, the second gate spacer includes a silicon oxide layer and a silicon nitride layer, and the first gate spacer includes silicon carbonitride. In an embodiment, the gate stack includes a second dielectric layer and a metal gate overlying the second dielectric layer, and the second gate spacer is removed after forming the gate stack. In an embodiment, the etching process uses an etching solution including hydrogen fluoride and ethanol. In an embodiment, the etching process uses an etching solution including hydrogen fluoride and water. In an embodiment, the etching process is performed at a temperature from minus 30° C. to 0° C.

In accordance with yet another embodiment, a method of manufacturing a semiconductor device includes forming a dummy gate over a semiconductor substrate; depositing a first spacer layer over the dummy gate; depositing a second spacer layer over the first spacer layer; depositing a third spacer layer over the second spacer layer; patterning the first spacer layer, the second spacer layer, and the third spacer layer to form a first gate spacer, a second gate spacer, and a third gate spacer, respectively; epitaxially growing source/drain regions on opposite sides of the dummy gate adjacent the third gate spacers; replacing the dummy gate with a metal gate; and after the replacing the dummy gate, removing the second gate spacer and the third gate spacer using an etching process at a temperature less than 0° C., the removing the second gate spacer and the third gate spacer forming a void exposing surfaces of the first gate spacer and the source/drain regions. In an embodiment, the method further includes forming an interlayer dielectric over the source/drain regions and the dummy gate; planarizing the interlayer dielectric and the dummy gate; etching back the interlayer dielectric to form a first opening; and filling the first opening with a hard mask, the removing the second gate spacer and the third gate spacer being performed after the filling the first opening. In an embodiment, the method further includes forming a dielectric layer over the hard mask, the metal gate, and the void, the dielectric layer sealing the void to form an air spacer adjacent the first gate spacer. In an embodiment, portions of the air spacer extend below portions of the source/drain regions in a direction perpendicular to a major surface of the semiconductor substrate. In an embodiment, the method further includes performing a second planarization planarizing the dielectric layer, the interlayer dielectric, the first gate spacer, and the metal gate, and removing the hard mask, the metal gate having a gate height from 10 nm to 60 nm before the second planarization, and the metal gate having a gate height from 10 nm to 30 nm after the second planarization. In an embodiment, the etching process uses an etching solution including hydrogen fluoride and water. In an embodiment, the etching process uses an etching solution including hydrogen fluoride and ethanol.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a gate stack on a substrate;
forming a first gate spacer on a sidewall of the gate stack;
forming a second gate spacer on a sidewall of the first gate spacer;
epitaxially growing a source/drain region adjacent the second gate spacer;
forming a contact etch stop layer on the second gate spacer and the source/drain region;
removing the second gate spacer to form a first opening, wherein the second gate spacer is removed after the forming the contact etch stop layer, wherein the first opening exposes a sidewall of the first gate spacer and a horizontal surface of the first gate spacer below a top surface of the first gate spacer; and
depositing a dielectric layer on the first gate spacer and the gate stack, the dielectric layer sealing a gas spacer in the first opening.

2. The method of claim 1, wherein removing the second gate spacer comprises etching the second gate spacer with a first etching process, wherein the first etching process is performed at a temperature less than 0° C.

3. The method of claim 1, wherein removing the second gate spacer comprises etching the second gate spacer with a first etching process, wherein the first etching process uses hydrogen fluoride as an etchant.

4. The method of claim 1, further comprising
forming an interlayer dielectric layer on the contact etch stop layer, wherein the second gate spacer is removed after forming the interlayer dielectric layer.

5. The method of claim 4, further comprising:
forming a second contact etch stop layer on the contact etch stop layer, the interlayer dielectric layer, and the dielectric layer after depositing the dielectric layer; and
forming a second interlayer dielectric layer on the second contact etch stop layer.

6. The method of claim 4, further comprising:
etching back the interlayer dielectric layer; and
depositing a hard mask over the interlayer dielectric layer, wherein the second gate spacer is removed after depositing the hard mask.

7. The method of claim 1, wherein removing the second gate spacer forms a solid etch film on surfaces of the gate stack, the first gate spacer, and the source/drain region, and wherein removing the second gate spacer forms a liquid etch film on surfaces of the second gate spacer.

8. A method comprising:
forming a gate stack on a semiconductor substrate;
forming a first gate spacer on the gate stack;
forming a second gate spacer on a sidewall of the first gate spacer;
epitaxially growing source/drain regions on opposite sides of the gate stack;
performing a first etch process on the second gate spacer to form a first opening, wherein the first etch process forms a first etch film on surfaces of the gate stack, the first gate spacer, and the source/drain regions, wherein the first etch process forms a second etch film on surfaces of the second gate spacer, and wherein the first etch film and the second etch film are different states of matter; and
depositing a first dielectric layer sealing the first opening and defining a gas spacer on sidewalls of the first gate spacer.

9. The method of claim 8, wherein the first etch film is a solid etch film, and wherein the second etch film is a liquid etch film.

10. The method of claim 8, wherein epitaxially growing the source/drain regions causes a first source/drain region and a second source/drain region adjacent the first source/drain region to merge, wherein a void is sealed between the first source/drain region and the second source/drain region after epitaxially growing the source/drain regions.

11. The method of claim 10, performing the first etch process unseals the void between the first source/drain region and the second source/drain region.

12. The method of claim 10, wherein the first source/drain region, the second source/drain region, and the second gate spacer define surfaces of the void.

13. The method of claim 8, further comprising:
forming a contact etch stop layer on the second gate spacer and the source/drain regions;
forming an interlayer dielectric layer on the contact etch stop layer; and
forming a source/drain contact in the contact etch stop layer and the interlayer dielectric layer, wherein the source/drain contact is electrically coupled to a first source/drain region of the source/drain regions, and wherein the interlayer dielectric layer is between the source/drain contact and the second gate spacer.

14. A method of manufacturing a semiconductor device, the method comprising:
forming a gate structure on a semiconductor substrate;
depositing a first spacer layer on the gate structure;
depositing a second spacer layer on the first spacer layer;
depositing a third spacer layer on the second spacer layer;
patterning the first spacer layer, the second spacer layer, and the third spacer layer to form a first gate spacer, a second gate spacer, and a third gate spacer, respectively;
epitaxially growing a source/drain region adjacent the third gate spacer; and
removing the second gate spacer and the third gate spacer to form a void, wherein the void exposes a side surface and a bottom surface of the source/drain region.

15. The method of claim 14, wherein the gate structure comprises a dummy gate, wherein the method further comprises replacing the dummy gate with a metal gate, wherein the second gate spacer and the third gate spacer are removed after replacing the dummy gate with the metal gate.

16. The method of claim 14, wherein the second gate spacer and the third gate spacer are removed using an etching process at a temperature less than 0° C.

17. The method of claim 14, wherein the second gate spacer and the third gate spacer are removed using an etching process that uses a first etchant comprising water and a second etchant comprising hydrogen fluoride.

18. The method of claim 14, wherein the void is formed extending past opposite sidewalls of the source/drain region in a cross-sectional view.

19. The method of claim 14, further comprising forming a first dielectric layer on the gate structure and the first gate spacer, wherein the first dielectric layer seals the void.

20. The method of claim 19, further comprising planarizing the first dielectric layer, the gate structure, and the first gate spacer.

* * * * *